US009077069B2

(12) United States Patent
Ali et al.

(10) Patent No.: US 9,077,069 B2
(45) Date of Patent: Jul. 7, 2015

(54) METHOD AND APPARATUS FOR TUNABLE ANTENNA AND GROUND PLANE FOR HANDSET APPLICATIONS

(71) Applicant: BlackBerry Limited, Waterloo (CA)

(72) Inventors: Shirook M. Ali, Milton, CA (US); Kasra Payandehjoo, Montreal, CA (US)

(73) Assignee: BlackBerry Limited, Waterloo, Ontario (CA)

( * ) Notice: Subject to any disclaimer, the term of this patent is extended or adjusted under 35 U.S.C. 154(b) by 263 days.

(21) Appl. No.: 13/647,959

(22) Filed: Oct. 9, 2012

(65) Prior Publication Data

US 2014/0098000 A1 Apr. 10, 2014

(51) Int. Cl.
*H01Q 1/24* (2006.01)

(52) U.S. Cl.
CPC .................................... *H01Q 1/243* (2013.01)

(58) Field of Classification Search
CPC ....... H01Q 1/243; H01Q 1/242; H01Q 1/241; H01Q 1/24; H01Q 1/50
USPC .......................... 343/702, 872, 848, 767, 861
See application file for complete search history.

(56) References Cited

U.S. PATENT DOCUMENTS 4,939,525 A 7/1990 Brunner
6,864,843 B2 3/2005 du Toit et al.
7,057,472 B2 6/2006 Fukamachi et al.
7,327,324 B2 * 2/2008 Wang et al. ................... 343/767
8,797,217 B2 8/2014 Yang et al.
2007/0200766 A1 8/2007 McKinzie et al.
2010/0053007 A1 3/2010 Ni et al.
2010/0245184 A1 9/2010 Talty et al.
2011/0309992 A1 12/2011 Ali
2012/0009983 A1 1/2012 Mow et al.
2012/0231750 A1 9/2012 Jin et al.
2013/0194139 A1 * 8/2013 Nickel et al. .................. 343/703
2014/0022132 A1 1/2014 Badaruzzaman et al.

FOREIGN PATENT DOCUMENTS

EP 2219265 A1 8/2010

OTHER PUBLICATIONS

Antonino-Daviu, E.; "Novel Antenna for Mobile Terminals Based on the Chassis-Antenna Coupling"; Antennas and Propagation Society International Symposium; vol. 1A; p. 503-506; Jul. 3-8, 2005; IEEE 2005.
Chegg; "AC Inductor Circuits"; Chegg Inc; p. 1-4; 2003-2012.
Hansen, P., et al.; "Dynamic Tuner for Narrow-Band VLF Submarine"; West Virginia Consortium Foundation; p. 1-3; 2002, 2010; retrieved http://www.dodtechmatch.com/DOD/Opportunities/SBIRView.aspx?id=N123-161&page= . . . on Aug. 23, 2012.

(Continued)

*Primary Examiner* — Hoang V Nguyen
(74) *Attorney, Agent, or Firm* — Conley Rose, P.C.; J. Robert Brown, Jr.

(57) ABSTRACT

An embodiment is directed to a device comprising an antenna, a chassis configured to be electrically coupled to the antenna and comprising a slot loaded with at least one tunable component, wherein: the slot is aligned along a longitudinal edge of the chassis, the slot is formed in an area of the chassis based on an identification of currents in the area, and the antenna and chassis are electrically connected at a location based on the area.

23 Claims, 18 Drawing Sheets

(56) References Cited

OTHER PUBLICATIONS

Young-Min Jo, et al; "Development of a Compact Internal Antenna for Commercial CDMA/GPS Folder Type Handsets"; Skycross; p. 1-4; Jan. 2005.

Hui Li, et al.; "Characteristic Mode Based on Tradeoff Analyisi of Antenna-Chassis Interactions for Multiple Antenna Terminals"; IEEE Transaction on Antennas and Propagation; vol. 6, No. 2; p. 2-14; Feb. 2012.

Nan Ni, et al.; "Tunable Dualband IFA Antenna Using LC Resonators"; Agile RF Inc.; p. 1-4; 2011.

Smith, Nathaniel J.; "Frequency and Impedence Agile Real-Time Tuning Network for 200-400 MHZ Antennas"; Antenna Measurement Techniques Association; p. 1-2 and 136-141; 2011.

Yu-Shin Wang, et al.; "A Short Open-End Slot Antenna With Equivalent Circuit Analysis"; IEEE Transactions on Antennas and Propagation; vol. 58, Issue 5; p. 1771-1775; May 2010.

European Patent Office Search Report, Application No. 13187638.5, 2014, 6 pages.

* cited by examiner

METHOD AND APPARATUS FOR TUNABLE ANTENNA AND GROUND PLANE FOR HANDSET APPLICATIONS

BACKGROUND

Advancements in computing technologies have made it possible to expand the scope and extent of communications capabilities. For example, mobile or handheld devices are in use for purposes of communication. Such devices may be used to, e.g., engage in a phone call or transmit or receive data.

Recent trends have dictated that devices be made as small as possible. For example, combining the small size of a mobile device with the increasing use of mobile devices presents a number of challenges. Antennas and filters associated with a mobile device must be able to discriminate between a number of signals to obtain a particular signal of interest. An antenna also needs to be an efficient radiator. However, all other things being equal, if a device is manufactured in accordance with a smaller form factor, performance might be compromised when using a correspondingly smaller antenna. Improvements in antenna design and manufacture are needed to accommodate smaller devices.

BRIEF DESCRIPTION OF THE DRAWINGS

The present disclosure may be understood, and its numerous objects, features and advantages obtained, when the following detailed description is considered in conjunction with the following drawings, in which.

DETAILED DESCRIPTION

Figure 1:
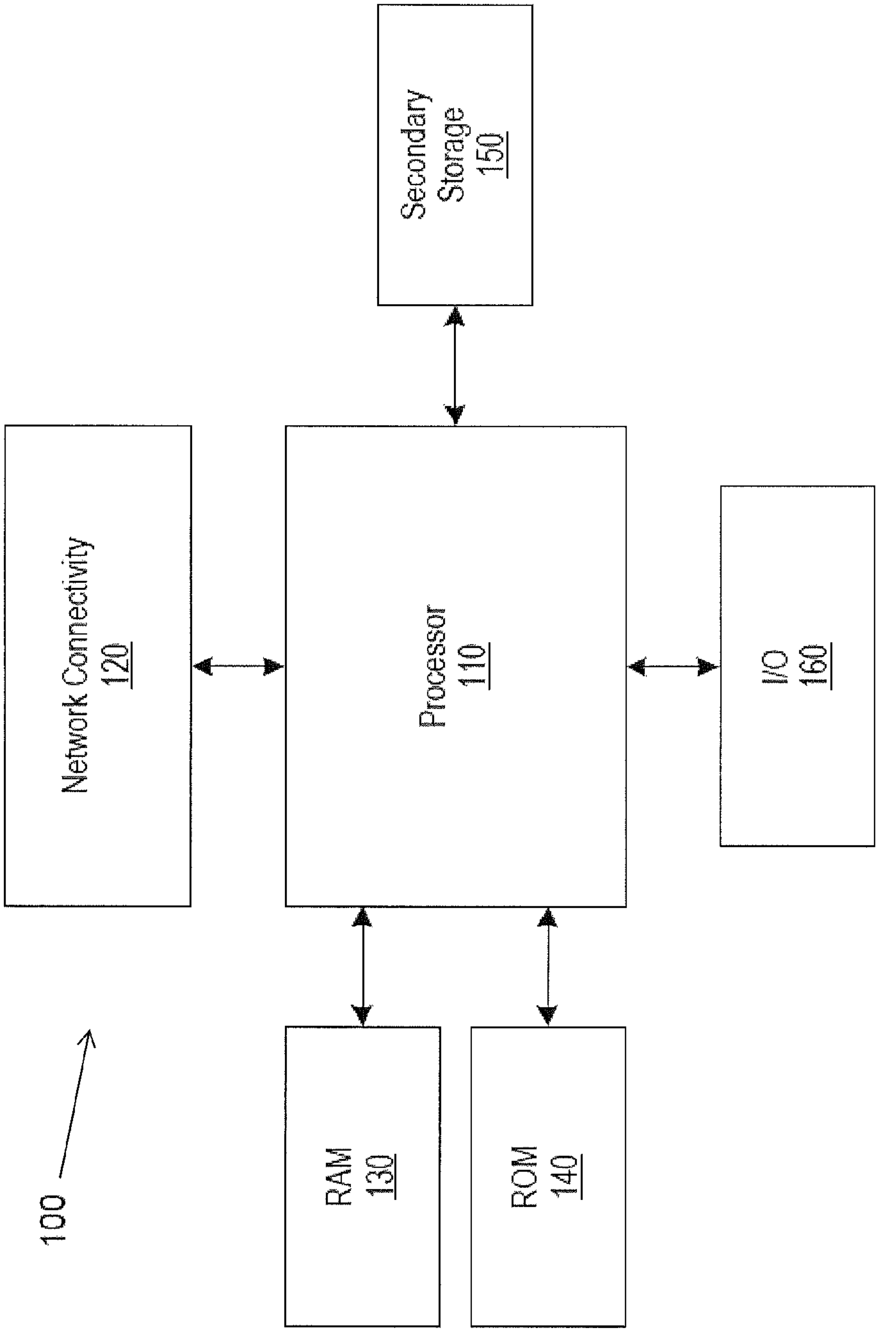
FIG. 1 depicts an exemplary system in which the present disclosure may be implemented.

The present disclosure is directed in general to communications systems and methods for operating same. In one aspect, the present disclosure relates to controlling radiation associated with an antenna. In some embodiments, the radiation may be controlled based on a modification of a ground plane, or a chassis associated with the ground plane. In some embodiments, the radiation may be controlled via a modification of a structure of the antenna.

An embodiment is directed to a device comprising an antenna, a chassis configured to be electrically coupled to the antenna and comprising a slot loaded with at least one tunable component, wherein: the slot is aligned along a longitudinal edge of the chassis, the slot is formed in an area of the chassis based on an identification of currents in the area, and the antenna and chassis are electrically connected at a location based on the area.

An embodiment is directed to a device comprising a chassis, an antenna configured to be electrically coupled to the chassis based on an alignment of an elongated part of a structure of the antenna with a longitudinal edge of the chassis, and at least one tunable component that is loaded at a location on the antenna structure, where the location is based on an identification of a maximum surface current at a particular operating frequency.

An embodiment is directed to a method for controlling radiation associated with an antenna via a modification of a ground plane, comprising identifying currents in an area of a chassis electrically coupled to the antenna to select a location to electrically connect the antenna and chassis, forming a slot in the area to confine and control the currents, aligning the formed slot to a longitudinal edge of the chassis loading the slot with at least one tunable component, tuning the slot to obtain a specified radiation performance of the antenna, and tuning the slot to control a current on the antenna surface to obtain a frequency tuning through the electrical coupling to the chassis.

An embodiment is directed to a method for controlling radiation associated with an antenna via a modification of a structure of the antenna, comprising selecting a location on the radiating structure with a maximum surface current at a frequency of interest to place at least one tunable element, loading the at least one tunable element at the location, and electrically coupling the antenna to a chassis by aligning an elongated part of the structure with a longitudinal edge of the chassis.

Various illustrative embodiments of the present disclosure will now be described in detail with reference to the accompanying figures. While various details are set forth in the following description, it will be appreciated that the present disclosure may be practiced without these specific details, and that numerous implementation-specific decisions may be made to the disclosure described herein to achieve specific goals, such as compliance with process technology or design-related constraints, which will vary from one implementation to another. While such a development effort might be complex and time-consuming, it would nevertheless be a routine undertaking for those of skill in the art having the benefit of this disclosure. For example, selected aspects are shown in block diagram and flowchart form, rather than in detail, in order to avoid limiting or obscuring the present disclosure. In addition, some portions of the detailed descriptions provided herein are presented in terms of algorithms or operations on data within a computer memory. Such descriptions and representations are used by those skilled in the art to describe and convey the substance of their work to others skilled in the art.

As used herein, the terms "component," "system" and the like are intended to refer to a computer-related entity, either hardware, software, a combination of hardware and software, or software in execution. For example, a component may be, but is not limited to being, a processor, a process running on a processor, an object, an executable instruction sequence, a thread of execution, a program, or a computer. By way of illustration, both an application running on a computer and the computer itself can be a component. One or more components may reside within a process or thread of execution and a component may be localized on one computer or distributed between two or more computers.

As likewise used herein, the term "node" broadly refers to a connection point, such as a redistribution point or a communication endpoint, of a communication environment, such as a network. Accordingly, such nodes refer to an active electronic device capable of sending, receiving, or forwarding information over a communications channel. Examples of such nodes include data circuit-terminating equipment (DCE), such as a modem, hub, bridge or switch, and data terminal equipment (DTE), such as a handset, a printer or a host computer (e.g., a router, workstation or server). Examples of local area network (LAN) or wide area network (WAN) nodes include computers, packet switches, cable modems, Data Subscriber Line (DSL) modems, and wireless LAN (WLAN) access points. Examples of Internet or Intranet nodes include host computers identified by an Internet Protocol (IP) address, bridges and WLAN access points. Likewise, examples of nodes in cellular communication include base stations, relays, base station controllers, radio network controllers, home location registers (HLR), visited location registers (VLR), Gateway GPRS Support Nodes (GGSN), Serving GPRS Support Nodes (SGSN), Serving Gateways (S-GW), and Packet Data Network Gateways (PDN-GW).

Other examples of nodes include client nodes, server nodes, peer nodes and access nodes. As used herein, a client node may refer to wireless devices such as mobile telephones, smart phones, personal digital assistants (PDAs), handheld devices, portable computers, tablet computers, and similar devices or other user equipment (UE) that has telecommunications capabilities. Such client nodes may likewise refer to a mobile, wireless device, or alternatively, to devices that have similar capabilities that are not generally transportable, such as desktop computers, set-top boxes, or sensors. A network node, as used herein, generally includes all nodes with the exception of client nodes, server nodes and access nodes. Likewise, a server node, as used herein, refers to an information processing device (e.g., a host computer), or series of information processing devices, that perform information processing requests submitted by other nodes. As likewise used herein, a peer node may sometimes serve as client node, and at other times, a server node. In a peer-to-peer or overlay network, a node that actively routes data for other networked devices as well as itself may be referred to as a supernode.

An access node, as used herein, refers to a node that provides a client node access to a communication environment. Examples of access nodes include cellular network base stations and wireless broadband (e.g., WiFi, WiMAX, etc.) access points, which provide corresponding cell and WLAN coverage areas. As used herein, a macrocell is used to generally describe a traditional cellular network cell coverage area. Such macrocells are typically found in rural areas, along highways, or in less populated areas. As likewise used herein, a microcell refers to a cellular network cell with a smaller coverage area than that of a macrocell. Such micro cells are typically used in a densely populated urban area. Likewise, as used herein, a picocell refers to a cellular network coverage area that is less than that of a microcell. An example of the coverage area of a picocell may be a large office, a shopping mall, or a train station. A femtocell, as used herein, currently refers to the smallest commonly accepted area of cellular network coverage. As an example, the coverage area of a femtocell is sufficient for homes or small offices.

In general, a coverage area of less than two kilometers typically corresponds to a microcell, 200 meters or less for a picocell, and on the order of 10 meters for a femtocell. The actual dimensions of the cell may depend on the radio frequency of operation, the radio propagation conditions and the density of communications traffic. As likewise used herein, a client node communicating with an access node associated with a macrocell is referred to as a "macrocell client." Likewise, a client node communicating with an access node associated with a microcell, picocell, or femtocell is respectively referred to as a "microcell client," "picocell client," or "femtocell client."

The term "article of manufacture" (or alternatively, "computer program product") as used herein is intended to encompass a computer program accessible from any computer-readable device or media. For example, computer readable media can include but are not limited to magnetic storage devices (e.g., hard disk, floppy disk, magnetic strips, etc.), optical disks such as a compact disk (CD) or digital versatile disk (DVD), smart cards, and flash memory devices (e.g., card, stick, etc.).

The word "exemplary" is used herein to mean serving as an example, instance, or illustration. Any aspect or design described herein as "exemplary" is not necessarily to be construed as preferred or advantageous over other aspects or designs. Those of skill in the art will recognize many modifications may be made to this configuration without departing from the scope, spirit or intent of the claimed subject matter. Furthermore, the disclosed subject matter may be implemented as a system, method, apparatus, or article of manufacture using standard programming and engineering techniques to produce software, firmware, hardware, or any combination thereof to control a computer or processor-based device to implement aspects detailed herein.

FIG. 1 illustrates an example of a system 100 suitable for implementing one or more embodiments disclosed herein. In various embodiments, the system 100 comprises a processor 110, which may be referred to as a central processor unit (CPU) or digital signal processor (DSP), network connectivity interfaces 120, random access memory (RAM) 130, read only memory (ROM) 140, secondary storage 150, and input/output (I/O) devices 160. In some embodiments, some of these components may not be present or may be combined in various combinations with one another or with other components not shown. These components may be located in a single physical entity or in more than one physical entity. Any actions described herein as being taken by the processor 110 might be taken by the processor 110 alone or by the processor 110 in conjunction with one or more components shown or not shown in FIG. 1.

The processor 110 executes instructions, codes, computer programs, or scripts that it might access from the network connectivity interfaces 120, RAM 130, or ROM 140. While only one processor 110 is shown, multiple processors may be present. Thus, while instructions may be discussed as being executed by a processor 110, the instructions may be executed simultaneously, serially, or otherwise by one or multiple processors 110 implemented as one or more CPU chips.

In various embodiments, the network connectivity interfaces 120 may take the form of modems, modem banks, Ethernet devices, universal serial bus (USB) interface devices, serial interfaces, token ring devices, fiber distributed data interface (FDDI) devices, wireless local area network (WLAN) devices (including radio, optical or infra-red signals), radio transceiver devices such as code division multiple access (CDMA) devices, global system for mobile communications (GSM) radio transceiver devices, long term evolution (LTE) radio transceiver devices, worldwide interoperability for microwave access (WiMAX) devices, and/or other well-known interfaces for connecting to networks, including Personal Area Networks (PANs) such as Bluetooth. These network connectivity interfaces 120 may enable the processor 110 to communicate with the Internet or one or more telecommunications networks or other networks from which the processor 110 might receive information or to which the processor 110 might output information.

The network connectivity interfaces 120 may also be capable of transmitting or receiving data wirelessly in the form of electromagnetic waves, such as radio frequency signals or microwave frequency signals. Information transmitted or received by the network connectivity interfaces 120 may include data that has been processed by the processor 110 or instructions that are to be executed by processor 110. The data may be ordered according to different sequences as may be desirable for either processing or generating the data or transmitting or receiving the data.

In various embodiments, the RAM 130 may be used to store volatile data and instructions that are executed by the processor 110. The ROM 140 shown in FIG. 1 may likewise be used to store instructions and data that is read during execution of the instructions. The secondary storage 150 is typically comprised of one or more disk drives, solid state drives, or tape drives and may be used for non-volatile storage of data or as an overflow data storage device if RAM 130 is not large enough to hold all working data. Secondary storage 150 may likewise be used to store programs that are loaded into RAM 130 when such programs are selected for execution. The I/O devices 160 may include liquid crystal displays (LCDs), Light Emitting Diode (LED) displays, Organic Light Emitting Diode (OLED) displays, projectors, televisions, touch screen displays, keyboards, keypads, switches, dials, mice, track balls, track pads, voice recognizers, card readers, paper tape readers, printers, video monitors, or other well-known input/output devices.

Figure 2:
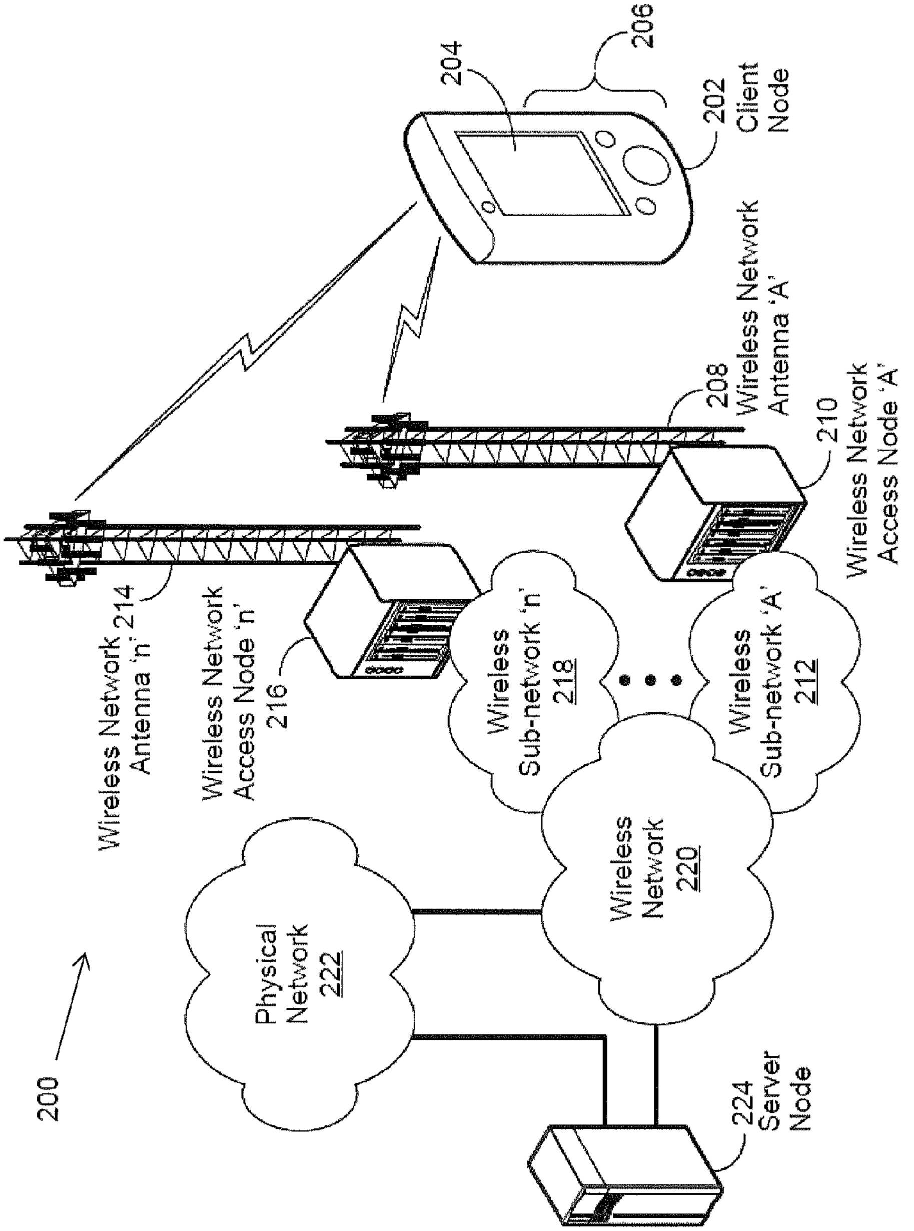
FIG. 2 shows a wireless-enabled communications environment including an embodiment of a client node.

FIG. 2 shows a wireless-enabled communications environment including an embodiment of a client node as implemented in an embodiment of the disclosure. Though illustrated as a mobile phone, the client node 202 may take various forms including a wireless handset, a pager, a smart phone, or a personal digital assistant (PDA). In various embodiments, the client node 202 may also comprise a portable computer, a tablet computer, a laptop computer, or any computing device operable to perform data communication operations. Many suitable devices combine some or all of these functions. In some embodiments, the client node 202 is not a general purpose computing device like a portable, laptop, or tablet computer, but rather is a special-purpose communications device such as a telecommunications device installed in a vehicle. The client node 202 may likewise be a device, include a device, or be included in a device that has similar capabilities but that is not transportable, such as a desktop computer, a set-top box, or a network node. In these and other embodiments, the client node 202 may support specialized activities such as gaming, inventory control, job control, task management functions, and so forth.

In various embodiments, the client node 202 includes a display 204. In these and other embodiments, the client node 202 may likewise include a touch-sensitive surface, a keyboard or other input keys 206 generally used for input by a user. The input keys 206 may likewise be a full or reduced alphanumeric keyboard such as QWERTY, DVORAK, AZERTY, and sequential keyboard types, or a traditional numeric keypad with alphabet letters associated with a telephone keypad. The input keys 206 may likewise include a trackwheel, an exit or escape key, a trackball, and other navigational or functional keys, which may be moved to different positions, e.g., inwardly depressed, to provide further input function. The client node 202 may likewise present options for the user to select, controls for the user to actuate, and cursors or other indicators for the user to direct.

The client node 202 may further accept data entry from the user, including numbers to dial or various parameter values for configuring the operation of the client node 202. The client node 202 may further execute one or more software or firmware applications in response to user commands. These applications may configure the client node 202 to perform various customized functions in response to user interaction. Additionally, the client node 202 may be programmed or configured over-the-air (OTA), for example from a wireless network access node 'A' 210 through 'n' 216 (e.g., a base station), a server node 224 (e.g., a host computer), or a peer client node 202.

Among the various applications executable by the client node 202 are a web browser, which enables the display 204 to display a web page. The web page may be obtained from a server node 224 through a wireless connection with a wireless network 220. As used herein, a wireless network 220 broadly refers to any network using at least one wireless connection between two of its nodes. The various applications may likewise be obtained from a peer client node 202 or other system over a connection to the wireless network 220 or any other wirelessly-enabled communication network or system.

In various embodiments, the wireless network 220 comprises a plurality of wireless sub-networks (e.g., cells with corresponding coverage areas) 'A' 212 through 'n' 218. As used herein, the wireless sub-networks 'A' 212 through 'n' 218 may variously comprise a mobile wireless access network or a fixed wireless access network. In these and other embodiments, the client node 202 transmits and receives communication signals, which are respectively communicated to and from the wireless network nodes 'A' 210 through 'n' 216 by wireless network antennas 'A' 208 through 'n' 214 (e.g., cell towers). In turn, the communication signals are used by the wireless network access nodes 'A' 210 through 'n' 216 to establish a wireless communication session with the client node 202. As used herein, the network access nodes 'A' 210 through 'n' 216 broadly refer to any access node of a wireless network. As shown in FIG. 2, the wireless network access nodes 'A' 210 through 'n' 216 are respectively coupled to wireless sub-networks 'A' 212 through 'n' 218, which are in turn connected to the wireless network 220.

In various embodiments, the wireless network 220 is coupled to a core network 222, e.g., a global computer network such as the Internet. Via the wireless network 220 and the core network 222, the client node 202 has access to information on various hosts, such as the server node 224. In these and other embodiments, the server node 224 may provide content that may be shown on the display 204 or used by the client node processor 110 for its operations. Alternatively, the client node 202 may access the wireless network 220 through a peer client node 202 acting as an intermediary, in a relay type or hop type of connection. As another alternative, the client node 202 may be tethered and obtain its data from a linked device that is connected to the wireless sub-network 212. Skilled practitioners of the art will recognize that many such embodiments are possible and the foregoing is not intended to limit the spirit, scope, or intention of the disclosure.

Figure 3:
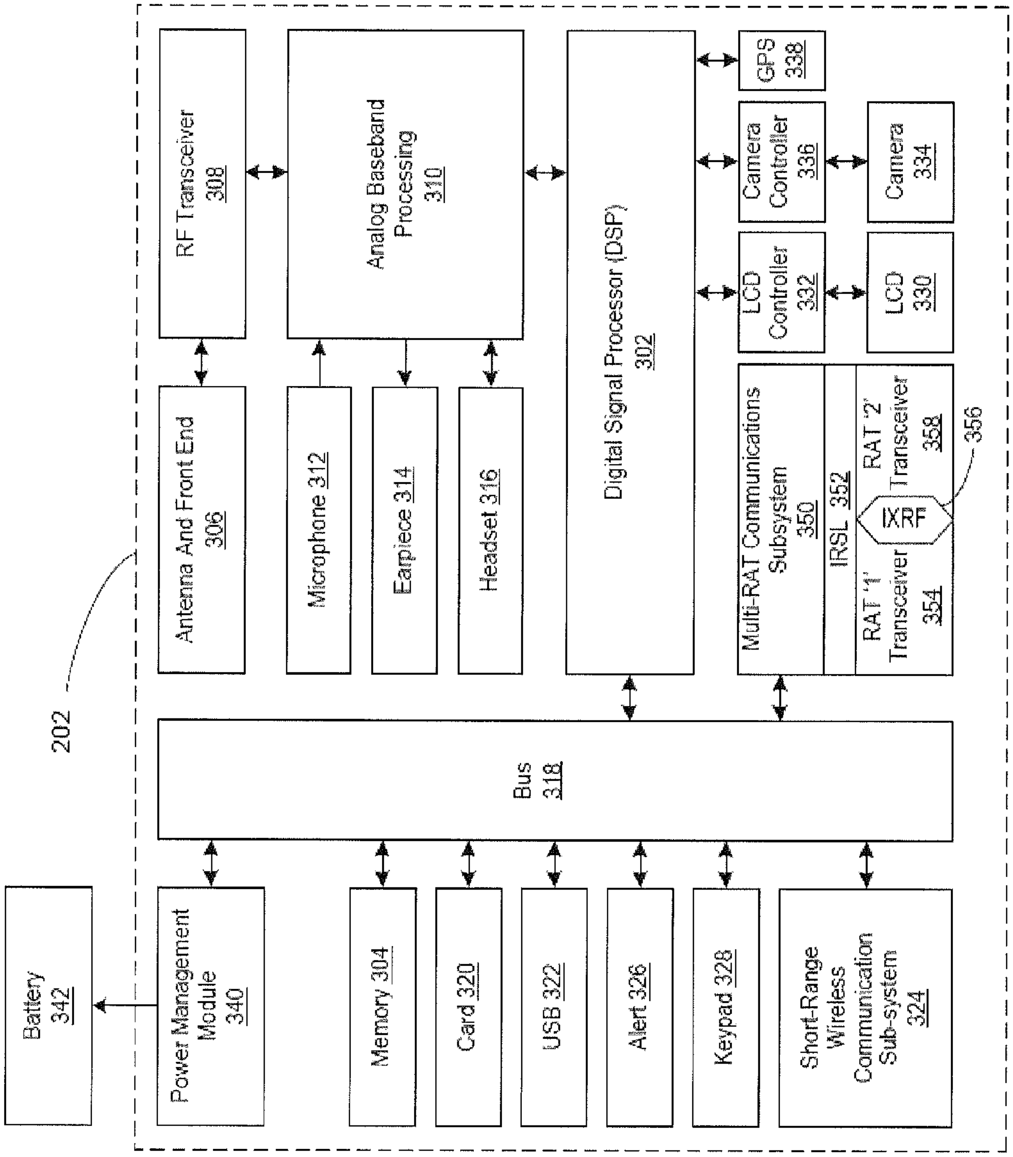
FIG. 3 is a simplified block diagram of an exemplary client node comprising a digital signal processor (DSP)

FIG. 3 depicts a block diagram of an exemplary client node as implemented with a digital signal processor (DSP) in accordance with an embodiment of the disclosure. While various components of a client node 202 are depicted, various embodiments of the client node 202 may include a subset of the listed components or additional components not listed. As shown in FIG. 3, the client node 202 includes a DSP 302 and a memory 304. As shown, the client node 202 may further include an antenna and front end unit 306, a radio frequency (RF) transceiver 308, an analog baseband processing unit 310, a microphone 312, an earpiece speaker 314, a headset port 316, a bus 318, such as a system bus or an input/output (I/O) interface bus, a removable memory card 320, a universal serial bus (USB) port 322, a short range wireless communication sub-system 324, an alert 326, a keypad 328, a liquid crystal display (LCD) 330, which may include a touch sensitive surface, an LCD controller 332, a charge-coupled device (CCD) camera 334, a camera controller 336, and a global positioning system (GPS) sensor 338, and a power management module 340 operably coupled to a power storage unit, such as a battery 342. In various embodiments, the client node 202 may include another kind of display that does not provide a touch sensitive screen. In one embodiment, the DSP 302 communicates directly with the memory 304 without passing through the input/output interface ("Bus") 318.

In various embodiments, the DSP 302 or some other form of controller or central processing unit (CPU) operates to control the various components of the client node 202 in accordance with embedded software or firmware stored in memory 304 or stored in memory contained within the DSP 302 itself. In addition to the embedded software or firmware, the DSP 302 may execute other applications stored in the memory 304 or made available via information media such as portable data storage media like the removable memory card 320 or via wired or wireless network communications. The application software may comprise a compiled set of machine-readable instructions that configure the DSP 302 to provide the desired functionality, or the application software may be high-level software instructions to be processed by an interpreter or compiler to indirectly configure the DSP 302.

The antenna and front end unit 306 may be provided to convert between wireless signals and electrical signals, enabling the client node 202 to send and receive information from a cellular network or some other available wireless communications network or from a peer client node 202. In an embodiment, the antenna and front end unit 106 may include multiple antennas to support beam forming and/or multiple input multiple output (MIMO) operations. As is known to those skilled in the art, MIMO operations may provide spatial diversity, which can be used to overcome difficult channel conditions or to increase channel throughput. Likewise, the antenna and front-end unit 306 may include antenna tuning or impedance matching components, RF power amplifiers, or low noise amplifiers.

In various embodiments, the RF transceiver 308 provides frequency shifting, converting received RF signals to baseband and converting baseband transmit signals to RF. In some descriptions a radio transceiver or RF transceiver may be understood to include other signal processing functionality such as modulation/demodulation, coding/decoding, interleaving/deinterleaving, spreading/despreading, inverse fast Fourier transforming (IFFT)/fast Fourier transforming (FFT), cyclic prefix appending/removal, and other signal processing functions. For the purposes of clarity, the description here separates the description of this signal processing from the RF and/or radio stage and conceptually allocates that signal processing to the analog baseband processing unit 310 or the DSP 302 or other central processing unit. In some embodiments, the RF Transceiver 108, portions of the Antenna and Front End 306, and the analog base band processing unit 310 may be combined in one or more processing units and/or application specific integrated circuits (ASICs).

Note that in this diagram the radio access technology (RAT) RAT1 and RAT2 transceivers 354, 358, the IXRF 356, the IRSL 352 and Multi-RAT subsystem 350 are operably coupled to the RF transceiver 308 and analog baseband processing unit 310 and then also coupled to the antenna and front end 306 via the RF transceiver 308. As there may be multiple RAT transceivers, there will typically be multiple antennas or front ends 306 or RF transceivers 308, one for each RAT or band of operation.

The analog baseband processing unit 310 may provide various analog processing of inputs and outputs for the RF transceivers 308 and the speech interfaces (312, 314, 316). For example, the analog baseband processing unit 310 receives inputs from the microphone 312 and the headset 316 and provides outputs to the earpiece 314 and the headset 316. To that end, the analog baseband processing unit 310 may have ports for connecting to the built-in microphone 312 and the earpiece speaker 314 that enable the client node 202 to be used as a cell phone. The analog baseband processing unit 310 may further include a port for connecting to a headset or other hands-free microphone and speaker configuration. The analog baseband processing unit 310 may provide digital-to-analog conversion in one signal direction and analog-to-digital conversion in the opposing signal direction. In various embodiments, at least some of the functionality of the analog baseband processing unit 310 may be provided by digital processing components, for example by the DSP 302 or by other central processing units.

The DSP 302 may perform modulation/demodulation, coding/decoding, interleaving/deinterleaving, spreading/despreading, inverse fast Fourier transforming (IFFT)/fast Fourier transforming (FFT), cyclic prefix appending/removal, and other signal processing functions associated with wireless communications. In an embodiment, for example in a code division multiple access (CDMA) technology application, for a transmitter function the DSP 302 may perform modulation, coding, interleaving, and spreading, and for a receiver function the DSP 302 may perform despreading, deinterleaving, decoding, and demodulation. In another embodiment, for example in an orthogonal frequency division multiplex access (OFDMA) technology application, for the transmitter function the DSP 302 may perform modulation, coding, interleaving, inverse fast Fourier transforming, and cyclic prefix appending, and for a receiver function the DSP 302 may perform cyclic prefix removal, fast Fourier transforming, deinterleaving, decoding, and demodulation. In other wireless technology applications, yet other signal processing functions and combinations of signal processing functions may be performed by the DSP 302.

The DSP 302 may communicate with a wireless network via the analog baseband processing unit 310. In some embodiments, the communication may provide Internet connectivity, enabling a user to gain access to content on the Internet and to send and receive e-mail or text messages. The input/output interface 318 interconnects the DSP 302 and various memories and interfaces. The memory 304 and the removable memory card 320 may provide software and data to configure the operation of the DSP 302. Among the interfaces may be the USB interface 322 and the short range wireless communication sub-system 324. The USB interface 322 may be used to charge the client node 202 and may also enable the client node 202 to function as a peripheral device to exchange information with a personal computer or other computer system. The short range wireless communication sub-system 324 may include an infrared port, a Bluetooth interface, an IEEE 802.11 compliant wireless interface, or any other short range wireless communication sub-system, which may enable the client node 202 to communicate wirelessly with other nearby client nodes and access nodes. The short-range wireless communication Sub-system 324 may also include suitable RF Transceiver, Antenna and Front End subsystems.

The input/output interface ("Bus") 318 may further connect the DSP 302 to the alert 326 that, when triggered, causes the client node 202 to provide a notice to the user, for example, by ringing, playing a melody, or vibrating. The alert 326 may serve as a mechanism for alerting the user to any of various events such as an incoming call, a new text message, and an appointment reminder by silently vibrating, or by playing a specific pre-assigned melody for a particular caller.

The keypad 328 couples to the DSP 302 via the I/O interface ("Bus") 318 to provide one mechanism for the user to make selections, enter information, and otherwise provide input to the client node 202. The keyboard 328 may be a full or reduced alphanumeric keyboard such as QWERTY, DVORAK, AZERTY and sequential types, or a traditional numeric keypad with alphabet letters associated with a telephone keypad. The input keys may likewise include a trackwheel, track pad, an exit or escape key, a trackball, and other navigational or functional keys, which may be inwardly depressed to provide further input function. Another input mechanism may be the LCD 330, which may include touch screen capability and also display text and/or graphics to the user. The LCD controller 332 couples the DSP 302 to the LCD 330.

The CCD camera 334, if equipped, enables the client node 202 to make digital pictures. The DSP 302 communicates with the CCD camera 334 via the camera controller 336. In another embodiment, a camera operating according to a technology other than Charge Coupled Device cameras may be employed. The GPS sensor 338 is coupled to the DSP 302 to decode global positioning system signals or other navigational signals, thereby enabling the client node 202 to determine its position. The GPS sensor 338 may be coupled to an antenna and front end (not shown) suitable for its band of operation. Various other peripherals may also be included to provide additional functions, such as radio and television reception.

In various embodiments, the client node (e.g., 202) comprises a first Radio Access Technology (RAT) transceiver 354 and a second RAT transceiver 358. As shown in FIG. 3, and described in greater detail herein, the RAT transceivers '1' 354 and '2' 358 are in turn coupled to a multi-RAT communications subsystem 350 by an Inter-RAT Supervisory Layer Module 352. In turn, the multi-RAT communications subsystem 350 is operably coupled to the Bus 318. Optionally, the respective radio protocol layers of the first Radio Access Technology (RAT) transceiver 354 and the second RAT transceiver 358 are operably coupled to one another through an Inter-RAT eXchange Function (IRXF) Module 356.

In various embodiments, the network node (e.g. 224) acting as a server comprises a first communication link corresponding to data to/from the first RAT and a second communication link corresponding to data to/from the second RAT.

Figure 4:
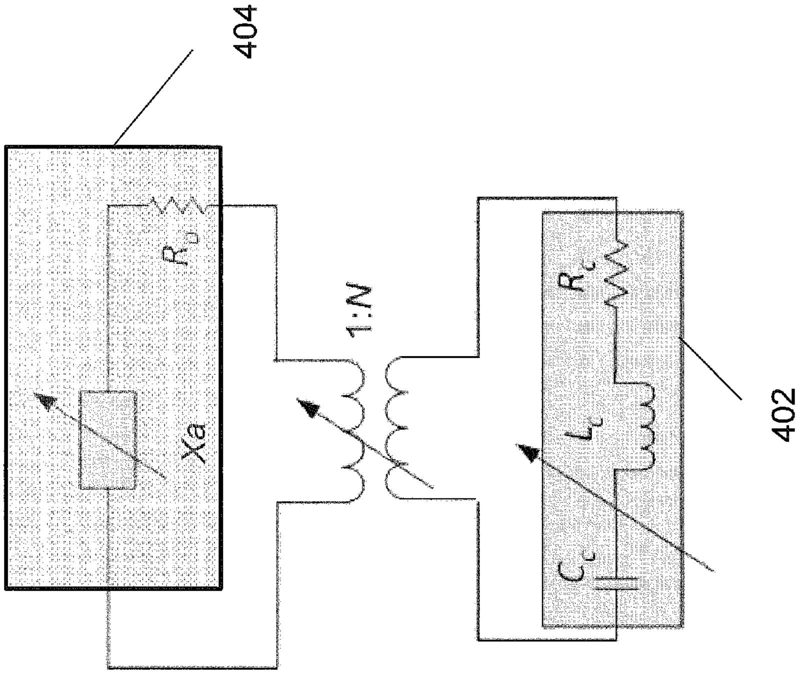
FIG. 4 is an exemplary schematic in accordance with one or more embodiments.

Turning now to FIG. 4, a schematic representation is shown. The schematic may be indicative of a front-end associated with a device, such as the antenna and front end 306 of FIG. 3.

A chassis 402 is shown in FIG. 4. The chassis 402 may be modeled or include one or more of a capacitor Cc, an inductor Lc, and a resistor Rc. Furthermore, one or both of the capacitor Cc and the inductor Lc may be varied or tuned, which may provide for a variable reactance with respect to the chassis 402.

The chassis 402 may be associated with, or include, a ground plane that may serve as a reference point with respect to an antenna 404. The antenna 404 may be modeled or include one or both of a resistor Ra and a reactance Xa. The reactance Xa may be implemented as a (variable or tunable) capacitor and/or an inductor.

The chassis 402 and antenna 404 may be modeled as being combined or electrically coupled to one another via a coupling factor N. In some embodiments, a radiation performance of the antenna 404 may be improved via the model shown in FIG. 4, such that the coupling factor N increases. The radiation performance may be measured in accordance with one or more parameters or criteria, such as bandwidth and efficiency. The antenna-chassis combination may form the overall radiation performance of the antenna 404, particularly at operating frequencies below 1 GHz.

In some embodiments, the radiation performance may be improved or enhanced by tuning one or more components associated with the chassis 402. For example, a resonance of a ground plane associated with the chassis 402 may be made to match the antenna 404, thereby satisfying the relation: $f_{antenna}=f_{chassis}$ that improves the overall antenna radiation performance.

Figure 5:
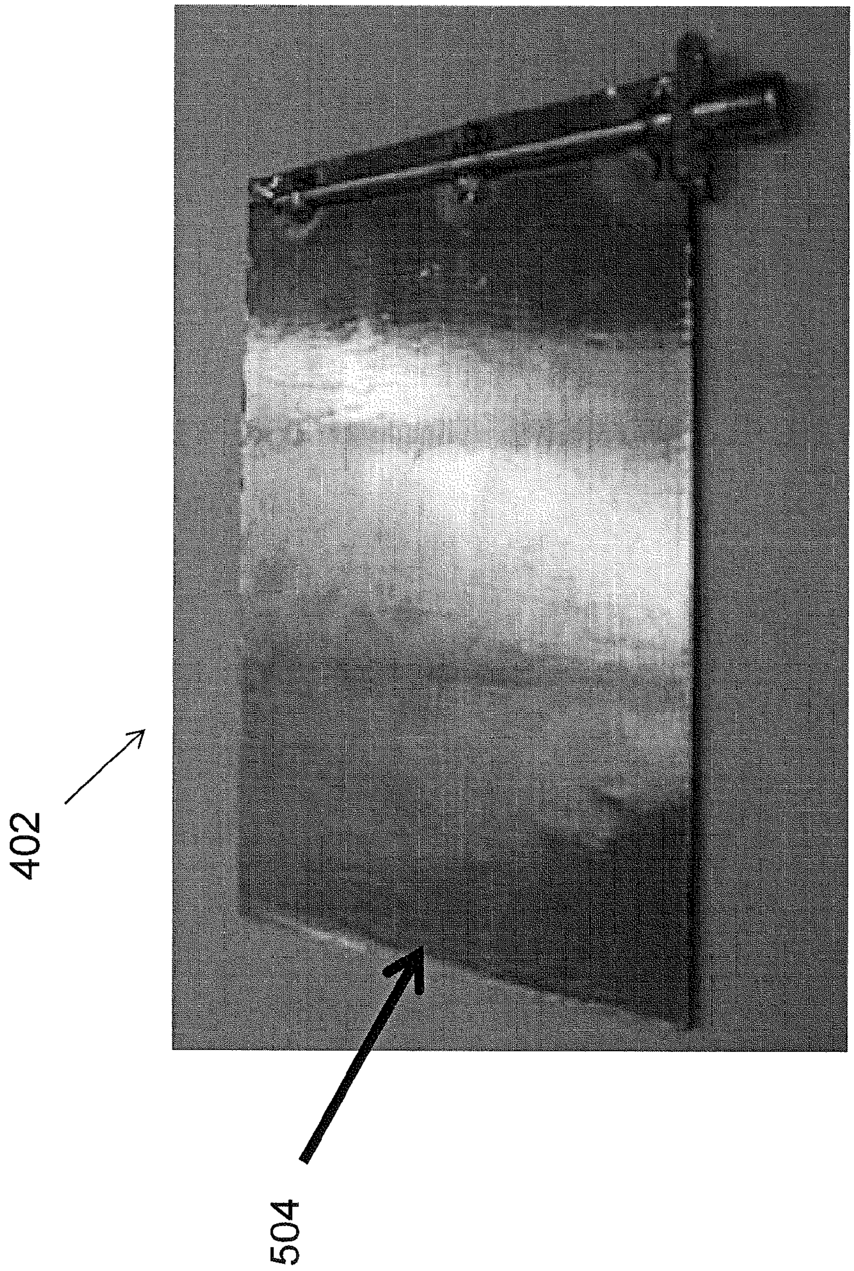
FIG. 5 is an exemplary chassis in accordance with one or more embodiments.

FIG. 5 illustrates an example of the chassis 402. The chassis may be made of one or more materials. For example, the chassis 402 may include a dielectric material and conductive material layer, e.g., a metal layer on the dielectric material. In an example, the metal is a copper layer. The chassis 402 may be manufactured as a printed circuit board (PCB). The chassis 402 may be fabricated with a feed line 504. The feed line 504 may be used to connect the antenna 404 to a transmitter or receiver. Various components (e.g., electrical components and/or mechanical components) known to those of skill in the art may be used to couple the chassis 402 and the antenna 404.

Figure 6A:
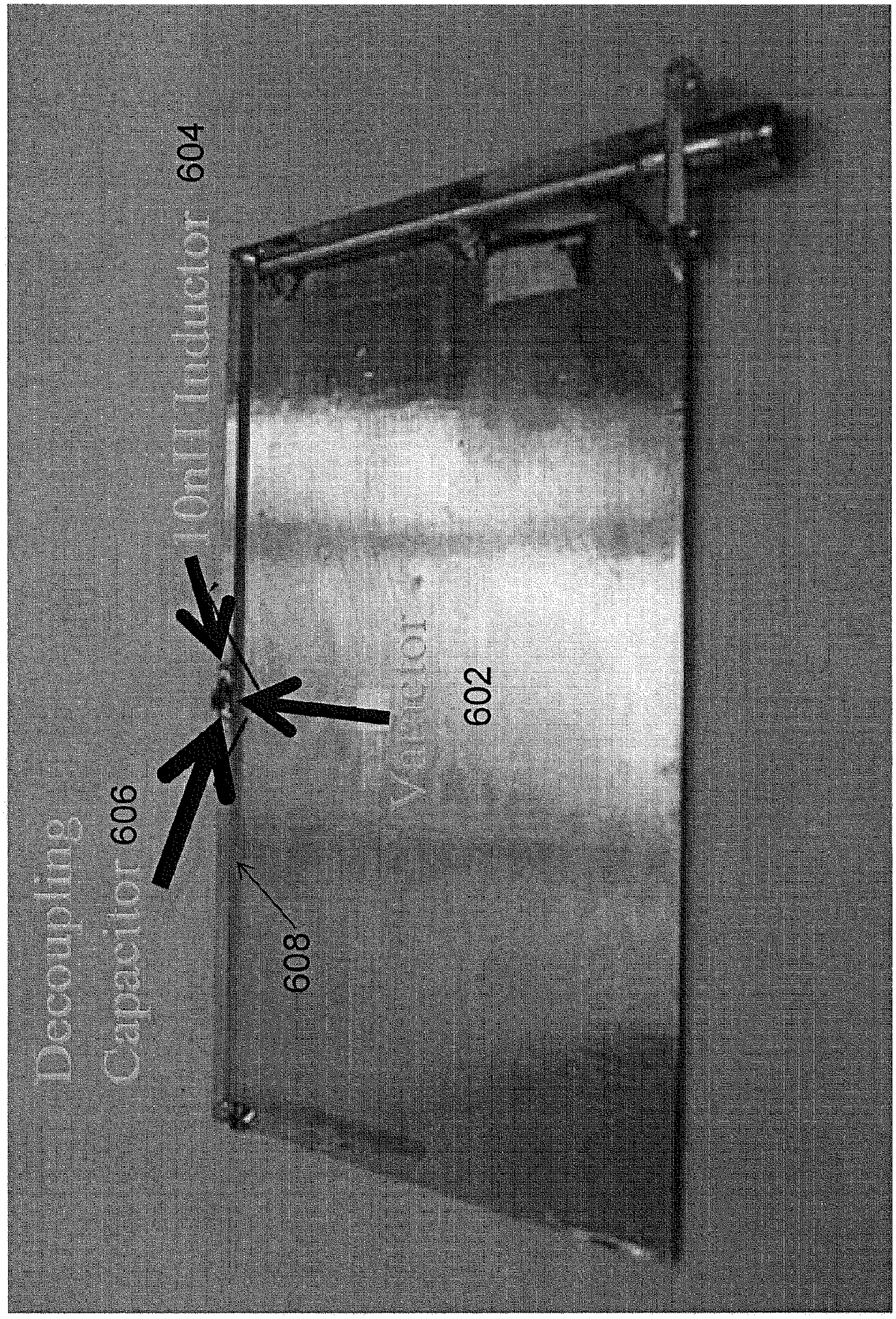
FIG. 6A is an exemplary chassis in accordance with one or more embodiments.

FIG. 6A illustrates an embodiment showing a modification of the chassis 402 of FIG. 5 to include one or more components. For example, FIG. 6A shows the inclusion of a varactor 602 and an inductor 604. In some embodiments, one or more decoupling capacitors 606 may be included to improve performance (e.g., to filter noise) and facilitate the biasing of the tunable capacitor/varactor 602.

The components shown in FIG. 6A may be associated with a slot 608. The slot 608 may be formed by etching conductive material, e.g., a metal layer, associated with the chassis 402 to expose the dielectric material. In other examples, the conductive material is formed on the dielectric layer by a positive process where the conductive material is laid down outside the slot 608. The location of the slot is such that to attract the surface currents on the chassis, usually placed in alignment to one or more of the chassis edges. One or more of the components may then be placed on the dielectric and in contact with metal of the etched slot 608.

Figure 6B:
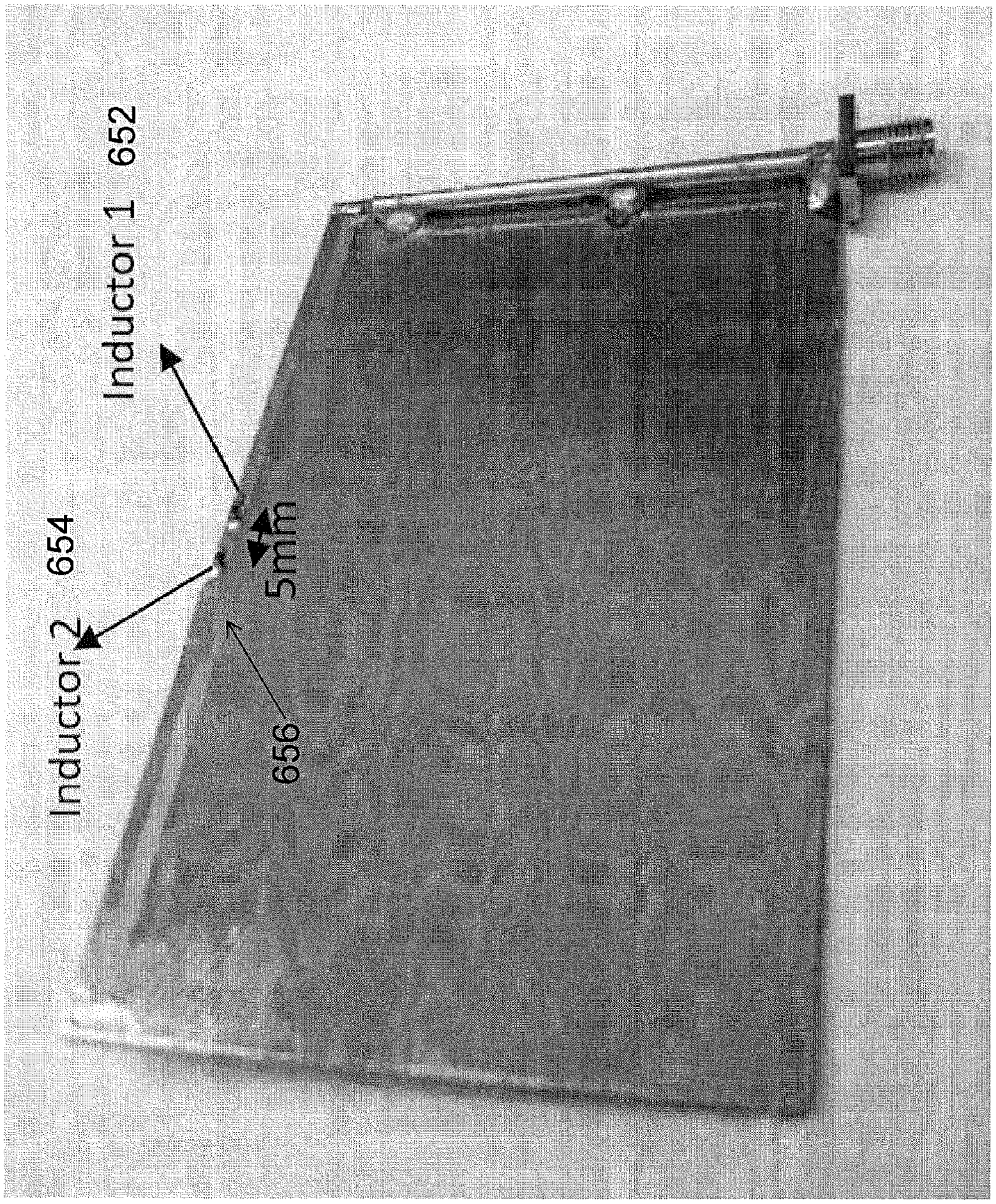
FIG. 6B is an exemplary chassis in accordance with one or more embodiments.

FIG. 6B illustrates another modification of the chassis 402 of FIG. 5 to include one or more components. For example, FIG. 6B shows the inclusion of inductors 652 and 654 in association with a slot 656.

Figure 7:
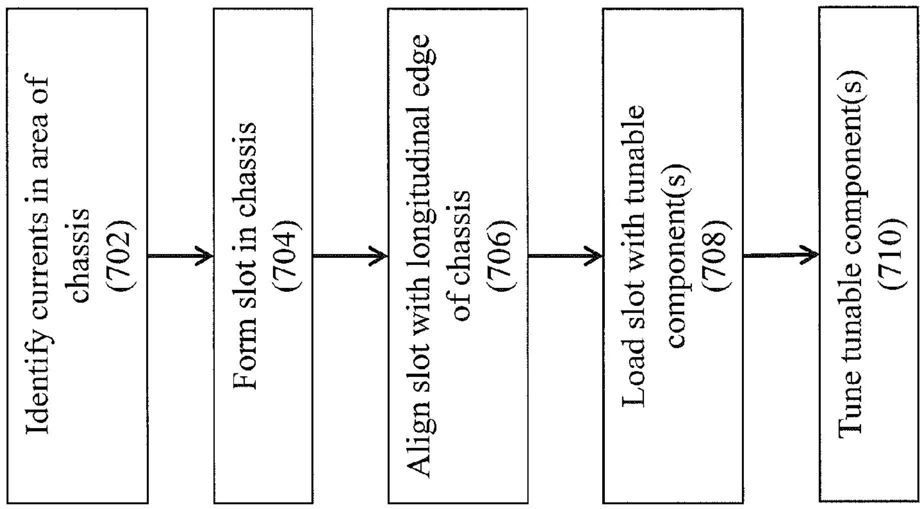
FIG. 7 is a flow chart of an exemplary method in accordance with one or more embodiments.

FIG. 7 illustrates a flow chart of a method that may be used to construct or fabricate a tunable chassis, such as a chassis 402 in connection with one or more of FIGS. 4, 5, 6A and/or 6B. The chassis may be fabricated to control radiation associated with an antenna (e.g., antenna 404). In some embodiments, the chassis is tuned to improve the resonance relation with that of the antenna. The tuning can also be used to tune the chassis-antenna resonance at multiple frequencies.

In block 702, currents (e.g., surface currents) in an area of the chassis may be identified to select a location to electrically connect the antenna and the chassis. The area or location of the currents may be identified using one or more techniques, such as trial-and-error, simulation, or any other technique available to a skilled artisan.

In block 704, a slot may be formed in the chassis. The slot may be formed by etching a portion of the chassis as described above. The slot may include an open end in some embodiments.

In block 706, the formed slot may be aligned with a longitudinal edge of the chassis. Such alignment may be used to provide for a high degree of coupling (N) between the antenna and the chassis. The slot may extend to align with a shorter edge of the chassis in some embodiments.

In block 708, the slot may be loaded with one or more tunable components (e.g., a tunable or variable capacitor). In some embodiments, one or more components (e.g., tunable components) may be switched in or out in order to modify a radiation performance associated with the antenna. Different performance characteristics may be obtained by changing a location of one or more components.

In block 710, one or more components may be varied or tuned. The tuning may be conducted to obtain a selected radiation performance profile for the antenna.

As described above, in some embodiments an antenna structure might not be altered to obtain a tunable antenna. In other words, the antenna may be designed in accordance with a fixed configuration and then turned into a tunable antenna through a ground plane electric coupling. Placement options may be more flexible when using the on-ground tuning approach relative to actually tuning the antenna. Using such an approach, effects of traces used for biasing capacitors may be reduced or minimized while also providing for a more stable placement of active elements on the ground plane. A broad bandwidth may be obtained, as return loss might not suffer with the bandwidth since the electrical coupling between the antenna and the ground plane may be optimized with each frequency tuning while maintaining the antenna bandwidth.

Figure 8:
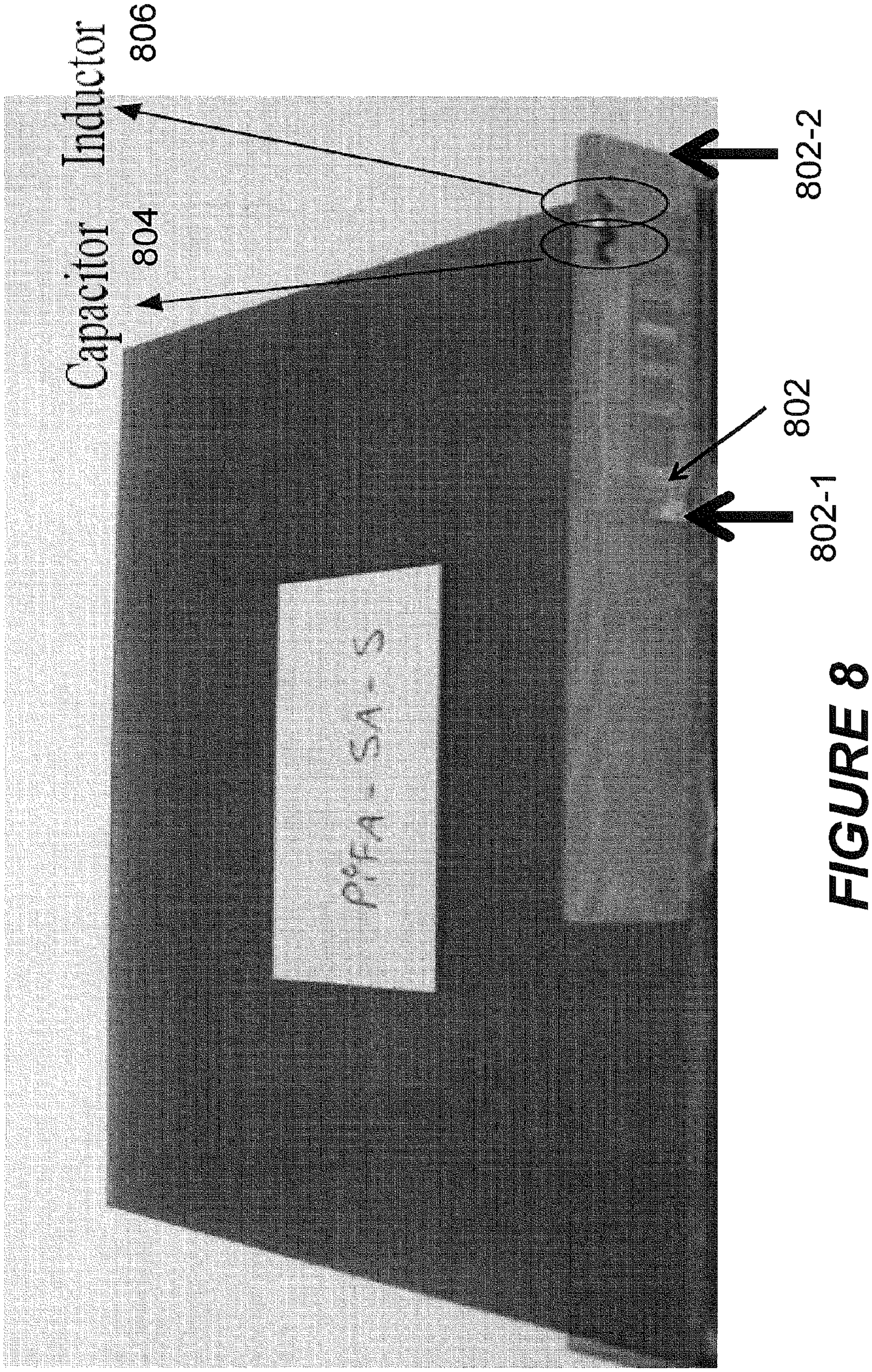
FIG. 8 is an exemplary antenna in accordance with one or more embodiments.

A structure of an antenna (e.g., antenna 404) may be modified in some embodiments in order to realize a tunable antenna. An example of such a modified antenna structure is shown in FIG. 8 where tuning is achieved controlling the surface currents at the antenna radiating structure. In FIG. 8, an antenna 802 (which may correspond to antenna 404) generally may assume a sawed or a meandered arm shape. The antenna 802 may be approximately 29 millimeters (mm) long and 7 mm high. The antenna 802 may be loaded with a (variable) capacitor 804 connected in series with an inductor 806. The antenna 802 may have a meandering or folding profile or configuration, such that an effective length or size of the antenna 802 may be realized without increasing the physical length or size of the antenna 802, where the effective length/size corresponds to the electrical length/size of the antenna 802, and the physical length/size of the antenna may correspond to a measurement of the antenna 802 from a first end 802-1 to a second end 802-2. The antenna 802 may be designed to cover a particular band or range of frequencies, such as 680 MHz to 980 MHz, for example. Coupling to a ground plane may be achieved through the alignment of the lower part (e.g., the elongated arm) of the antenna structure 802 with the longitudinal edge of the chassis.

Figure 9:
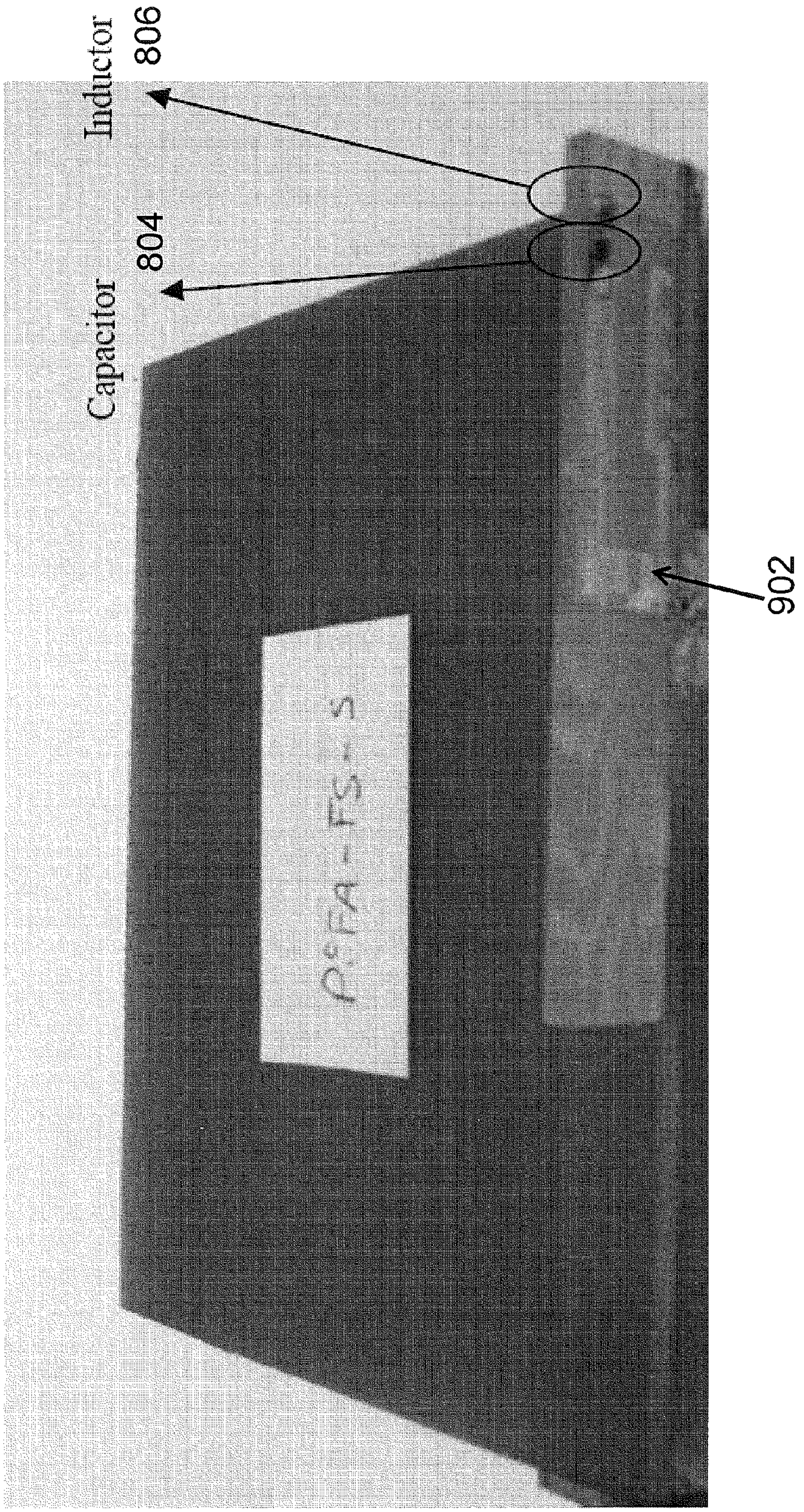
FIG. 9 is an exemplary antenna in accordance with one or more embodiments.

FIG. 9 illustrates a modified antenna structure 902. The antenna 902 may be similar to the antenna 802 of FIG. 8, except the antenna 902 may be slightly longer (e.g., 2-5 millimeters longer, 32 mm compared to 29 mm for antenna 802). The longer actual length for antenna 902 may come from less meandering relative to the antenna 802. The spaces within the antenna 902 may be used to place, e.g., buttons or keys, which may be useful in connection with a computing device (e.g., a mobile or handheld device). For example, such buttons or keys may be used to provide functionality (e.g., an input/output interface) with respect to the computing device.

Figure 10:
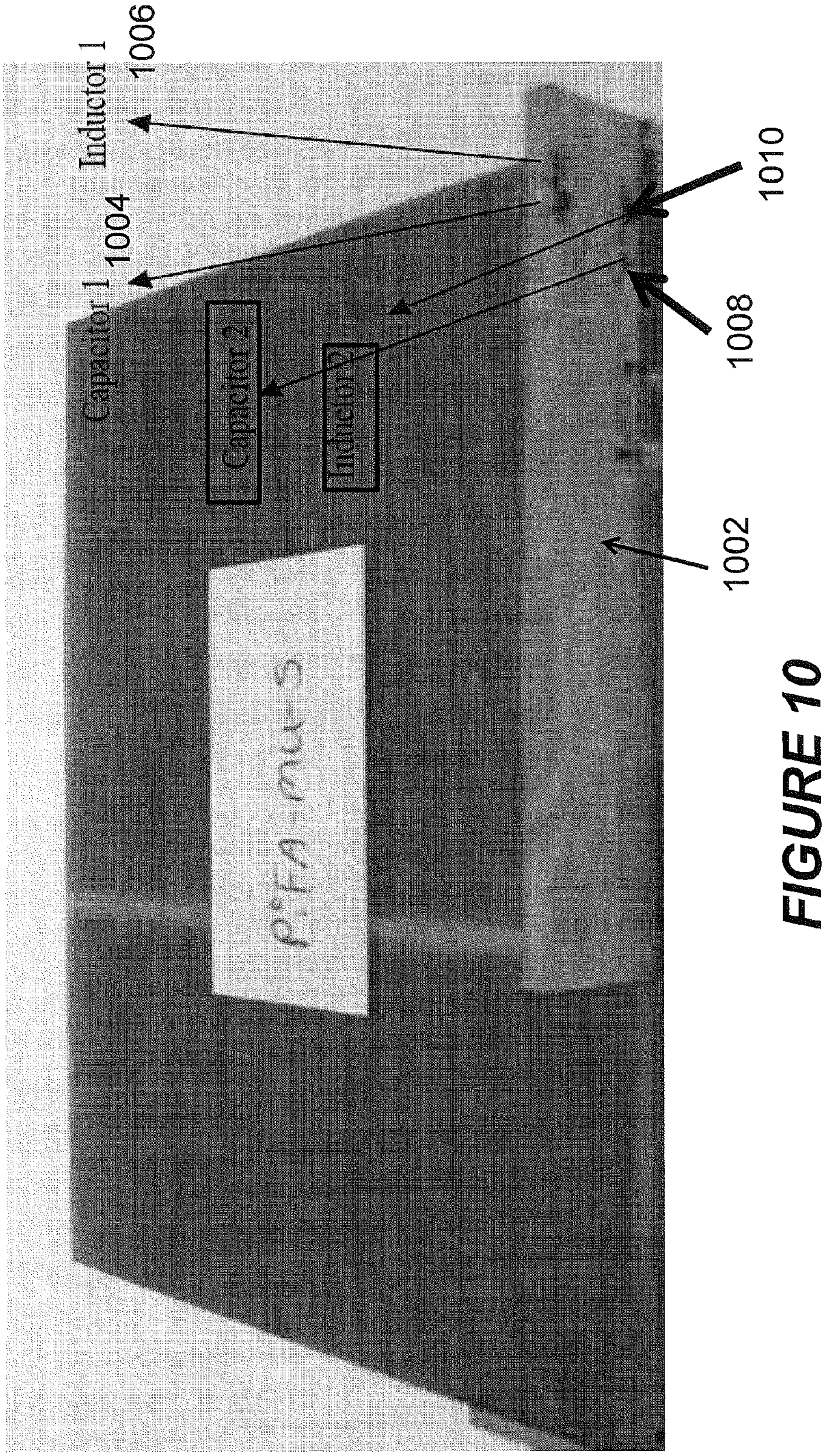
FIG. 10 is an exemplary antenna in accordance with one or more embodiments.

FIG. 10 illustrates a modified antenna structure 1002. The antenna 1002 may correspond to an effective combination of the antennas 802 and 902 in an interleaving manner and may be used to achieve independent high and low band on antenna tuning through two meandered and folded arms. The antenna 1002 may be 29 mm long and 7 mm in height. The antenna 1002 may include a first set of components, such as a tunable capacitor 1004 connected in series with an inductor 1006, to obtain a tuning over a first frequency band (e.g., the low band). The antenna 1002 may include a second set of components, such as a tunable capacitor 1008 connected in series with an inductor 1010, to obtain a tuning over a second frequency band (e.g., the high band). The tuning components may be located on, e.g., inverted-F antenna (IFA) arms just after a feed location in order to maximize a tuning range. In some embodiments, the antenna utilizes coupling with the ground plane electrically through the longitudinal edges of the chassis, and thus, does not require ground clearance and features a compact physical size.

Figure 11:
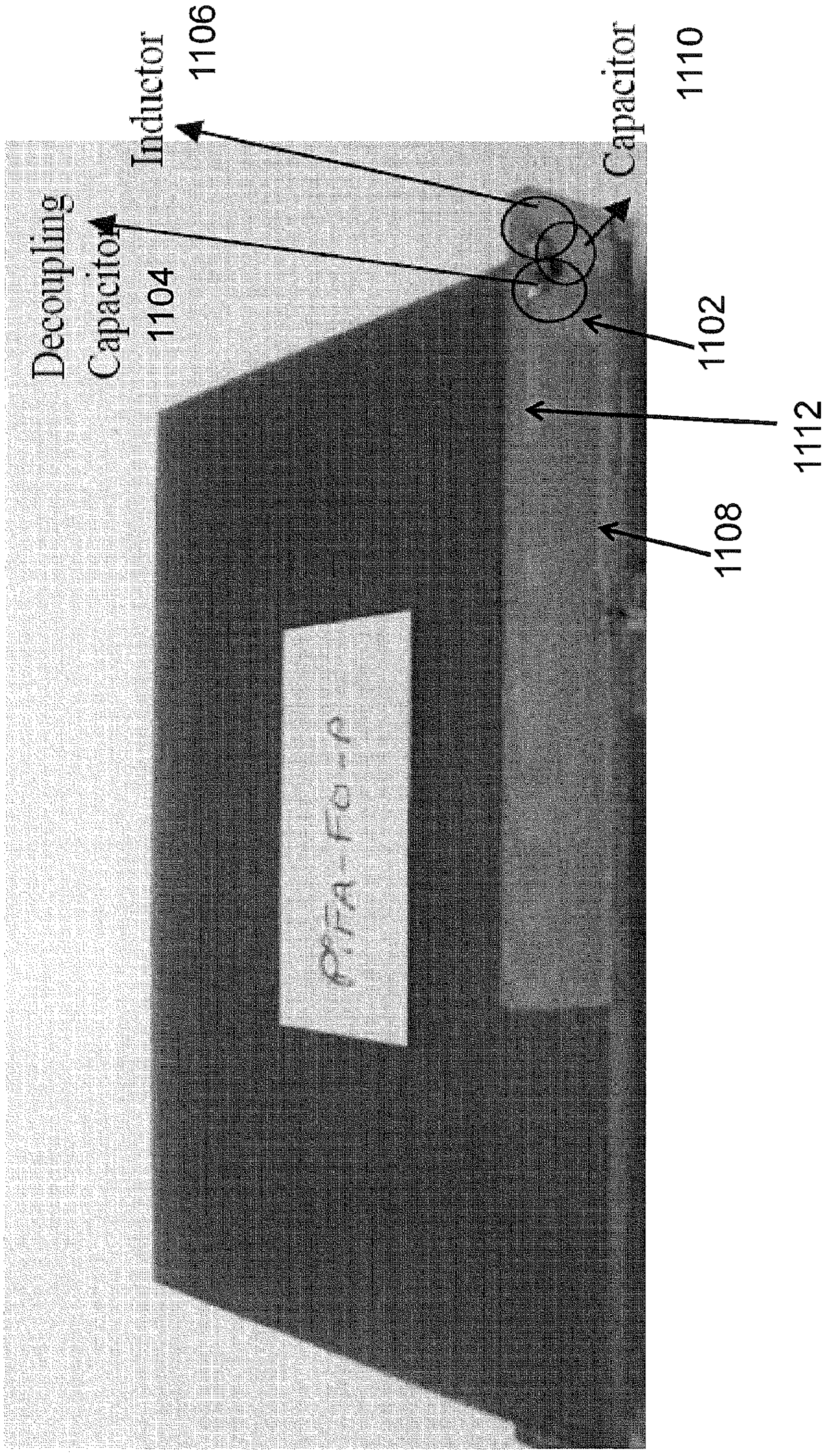
FIG. 11 is an exemplary antenna in accordance with one or more embodiments.

FIG. 11 illustrates a modified antenna structure 1102. In FIG. 11, ground coupling may be used to improve or enhance performance by including a coupling arm 1108, thereby allowing a reduction in the length of the antenna 1102. In addition to the coupling arm 1108, the antenna 1102 may include an upper arm 1112. The antenna 1102 may be 32 mm long and 7 mm high. Tuning may be achieved via a capacitor 1110 and inductor 1106 arranged in a parallel fashion with respect to one another, thereby providing an additional resonance for, e.g., high and low band tuning Additional components, such as a capacitor 1104, may be included. In some embodiments, the capacitor 1104 may be used as a decoupling capacitor and may facilitate biasing one or more components, such as a varacator or the capacitor 1110.

In some embodiments, the location of an antenna (e.g., one or more of antennas 802, 902, 1002, and 1102) may be based on a location of one or more slots on a chassis (e.g. slots 608 and 656). For example, the location of the antenna may be selected based on a shape, configuration, or geometry associated with the antenna. The location of the antenna may be selected so as to control or configure currents associated with a ground plane of the chassis. In some embodiments, the electrical length of a slot may be tuned through loadings of the slot to improve performance or change a frequency of operation.

Figure 12A:
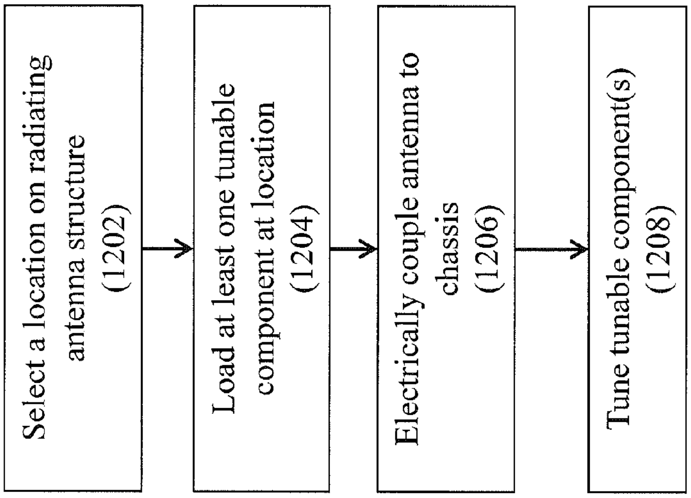
FIG. 12A is a flow chart of an exemplary method in accordance with one or more embodiments.

FIG. 12A illustrates a flow chart of a method that may be used to construct or fabricate an antenna, such as one or more of the antennas shown in connection with FIGS. 8-11. The antenna may be fabricated to provide control over radiation associated with the antenna.

In block 1202, a location may be selected on a radiating structure of the antenna. The location may be selected based on an identification of a maximum surface current at a frequency or frequency range/band of interest. The location may be identified using one or more techniques, such as those described above.

In block 1204, at least one tunable component may be loaded at the location selected in block 1202.

In block 1206, the antenna may be electrically coupled to a chassis. The coupling may occur by aligning an elongated part of the structure with a longitudinal edge of the chassis. In some embodiments, the antenna might not include any clearance with respect to a ground or ground plane associated with the chassis.

In block 1208, one or more components may be tuned. For example, a tunable component loaded in connection with block 1204 may be tuned in block 1208.

Figure 12B:
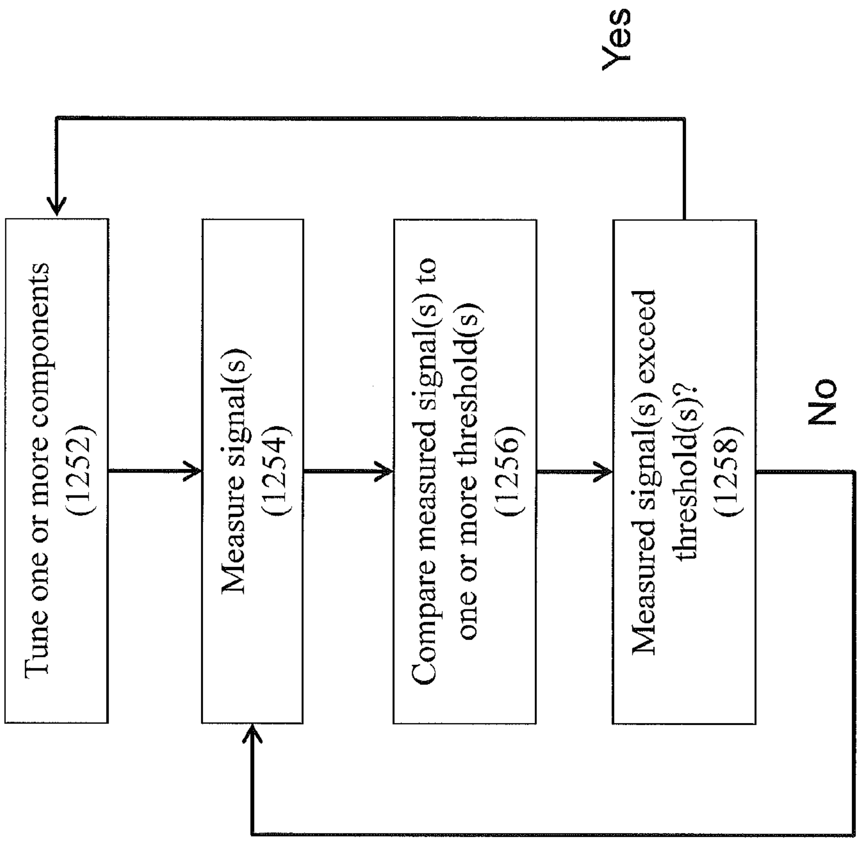
FIG. 12B is a flow chart of an exemplary method in accordance with one or more embodiments.

FIG. 12B illustrates a flow chart of a method that may be used to tune a ground plane or chassis (e.g., chassis 402 of FIG. 4). The tuning may be performed after the chassis and/or an antenna is fabricated. The tuning may be performed to, e.g., match carrier requirements during use, to improve performance during use, etc.

In block 1252, one or more components located on, e.g., the chassis may be tuned. The tuning may occur in real-time. In some embodiments, a (pre-defined) table of values may be used to select or set a value for one or more of the components. The values may be based at least in part on an operating frequency or frequency range(s)/band(s) of interest. The values used for the components may be tuned to optimize or maximize radiation performance at the operating frequency or frequency range(s)/band(s). The table may include settings to improve performance, to compensate for detuning effects potentially brought about by, e.g., a user, etc.

In block 1254, one or more signals may be measured. The signals may be associated with a transmission or a reception with respect to, e.g., a handset. In some embodiments, the signals may include one or more test signals.

In block 1256, the signals measured in block 1254 may be compared to one or more thresholds. The thresholds may be selected so as to ensure a particular level of performance.

In block 1258, a determination may be made whether the measured signal(s) exceed the threshold(s) based on the comparison of block 1256. If the measured signal(s) exceed the threshold(s) (e.g., the "Yes" path is taken out of block 1258), then flow may proceed from block 1258 to block 1252 to tune one or more of the components. On the other hand, if the measured signal(s) do not exceed the threshold(s) (e.g., the "No" path is taken out of block 1258), then flow may proceed from block 1258 to block 1254 to continue measuring the signal(s). Execution of the method of FIG. 12B may be used to monitor performance (e.g., radiation performance) associated with an antenna, and based on the monitored performance, an adjustment or tuning may occur.

Figure 13A:
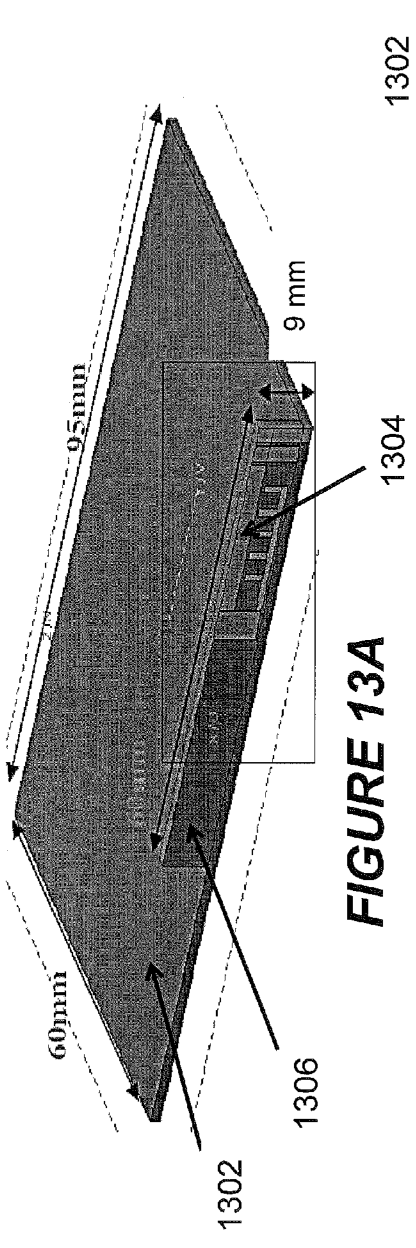
FIG. 13A is a line drawing of an exemplary chassis coupled to an antenna in accordance with one or more embodiments.

FIG. 13A illustrates a line drawing of an exemplary chassis 1302 coupled to an antenna 1304 in accordance with one or more embodiments. As shown, the chassis 1302 may be approximately 95 millimeters (mm) in length and 60 mm in width. The antenna 1304 may be approximately 9 mm in height and the antenna may be coupled to a dielectric material 1306 that is approximately 60 mm in length.

Figure 13B:
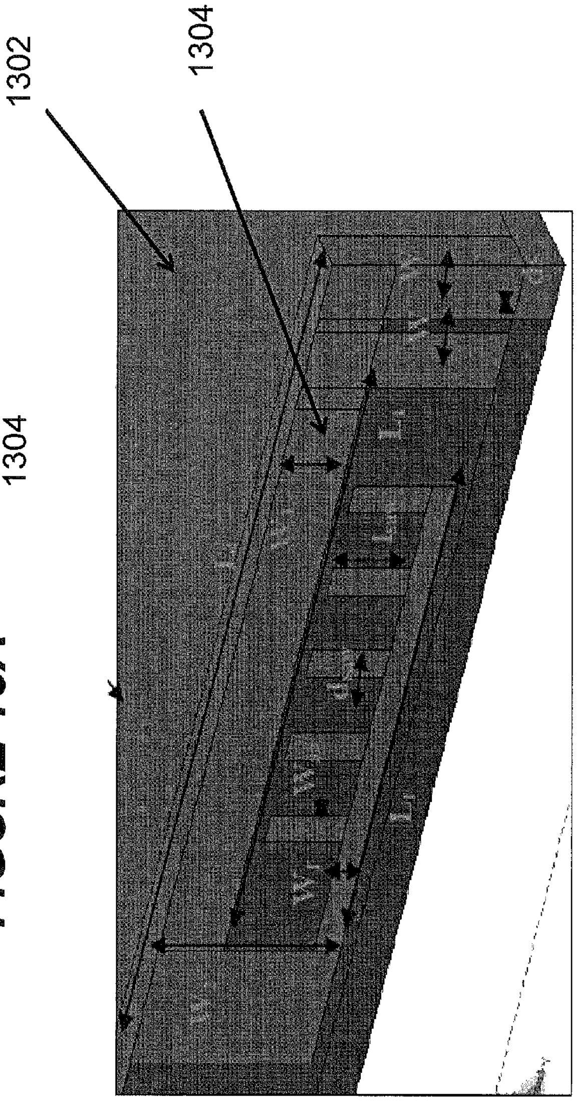
FIG. 13B is a zoomed-in, perspective view of the antenna of FIG. 13B.

FIG. 13B illustrates a zoomed-in view of the antenna 1304 of FIG. 13A. As shown in FIG. 13B, the antenna 1304 may take the form of a folded sawed arm. In some embodiments, dimensions shown in FIG. 13B may be as follows: W=2 mm, $W_1$=2.5 mm, $W_2$=7 mm, $d_s$=0.5 mm, $W_f$=1 mm, and $L_t$=29 mm.

The line drawings of FIGS. 13A and 13B may correspond to the embodiment shown in FIG. 8. While not explicitly shown in FIGS. 13A and 13B, the chassis 1302 and/or the antenna 1304 may include a slot and one or more tunable components, such as the capacitor 804 and the inductor 806. The chassis 1302 may be associated with a ground plane.

Figure 14:
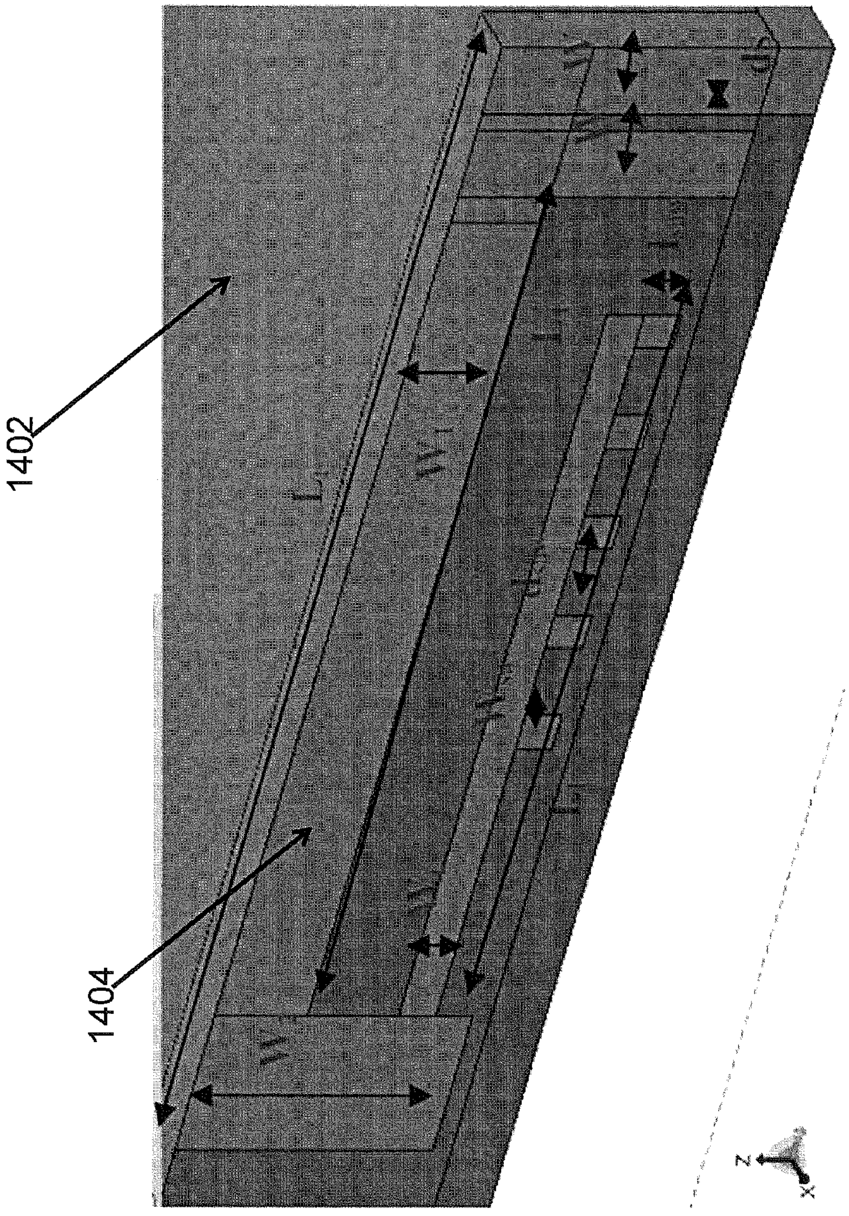
FIG. 14 is a line drawing of an exemplary antenna in accordance with one or more embodiments.

FIG. 14 illustrates a line drawing of an exemplary antenna 1404 in accordance with one or more embodiments. As shown in FIG. 14, the antenna 1404 may take the form of a flipped folded sawed arm. In some embodiments, dimensions shown in FIG. 14 may be as follows: W=2 mm, $W_1$=2.5 mm, $W_2$=7 mm, $d_s$=0.5 mm, $W_f$=1 mm, $d_{saw}$=2 mm, and $L_t$=29 mm.

The line drawing of FIG. 14 may correspond to the embodiment shown in FIG. 9. While not explicitly shown in FIG. 14, the antenna 1404 may include one or more tunable components, such as the capacitor 804 and the inductor 806. The antenna 1404 may be coupled to a chassis 1402 that may: (1) be associated with a ground plane, and (2) include a slot.

Figure 15:
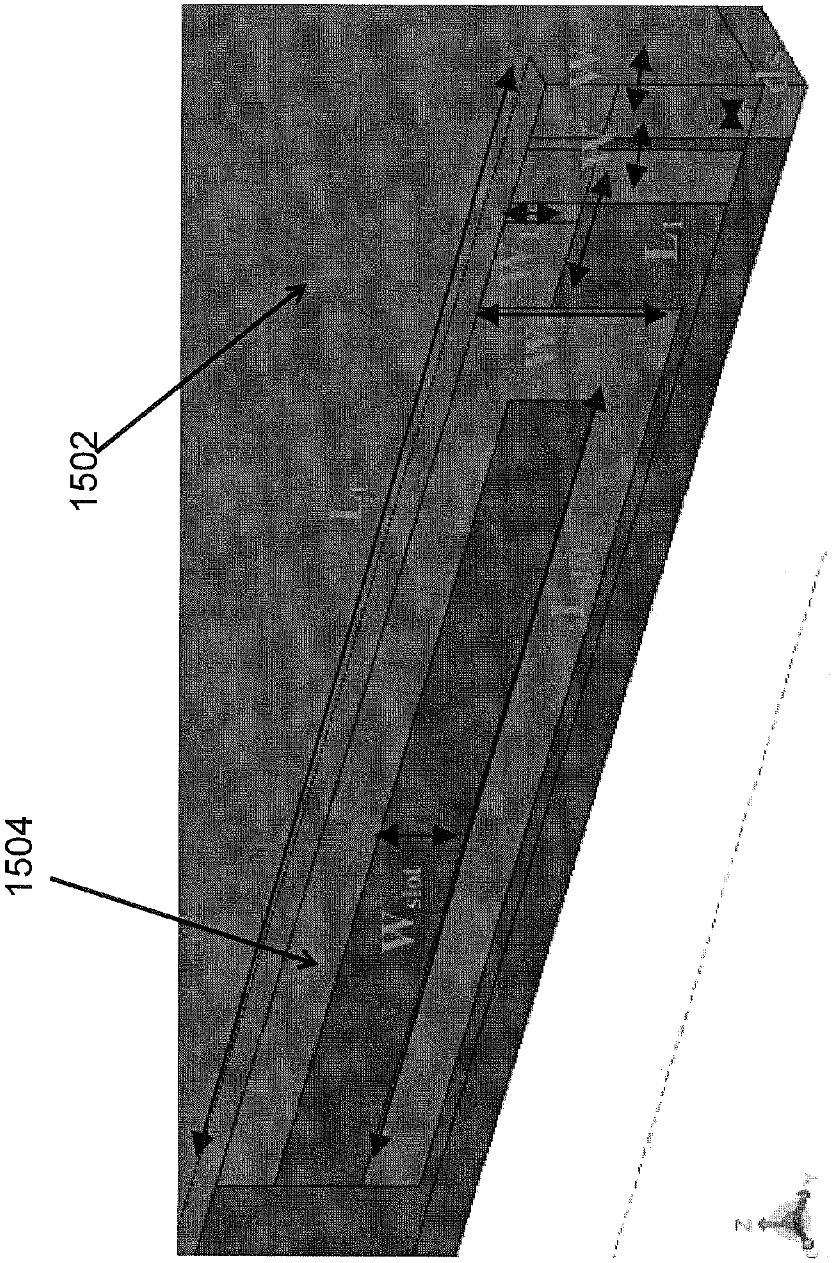
FIG. 15 is a line drawing of an exemplary antenna in accordance with one or more embodiments.

FIG. 15 illustrates a line drawing of an exemplary antenna 1504 in accordance with one or more embodiments. As shown in FIG. 15, the antenna 1504 may take the form of an inverted-F antenna (IFA) with a coupling arm. In some embodiments, dimensions shown in FIG. 15 may be as follows: W=2 mm, $W_1$=2.5 mm, $W_2$=7 mm, $d_s$=0.5 mm, and $L_t$=29 mm.

The line drawing of FIG. 15 may correspond to the embodiment shown in FIG. 11. While not explicitly shown in FIG. 15, the antenna 1504 may include one or more tunable components, such as the capacitor 1110 and the inductor 1106. The antenna 1504 may be coupled to a chassis 1502 that may: (1) be associated with a ground plane, and (2) include a slot.

Figure 16:
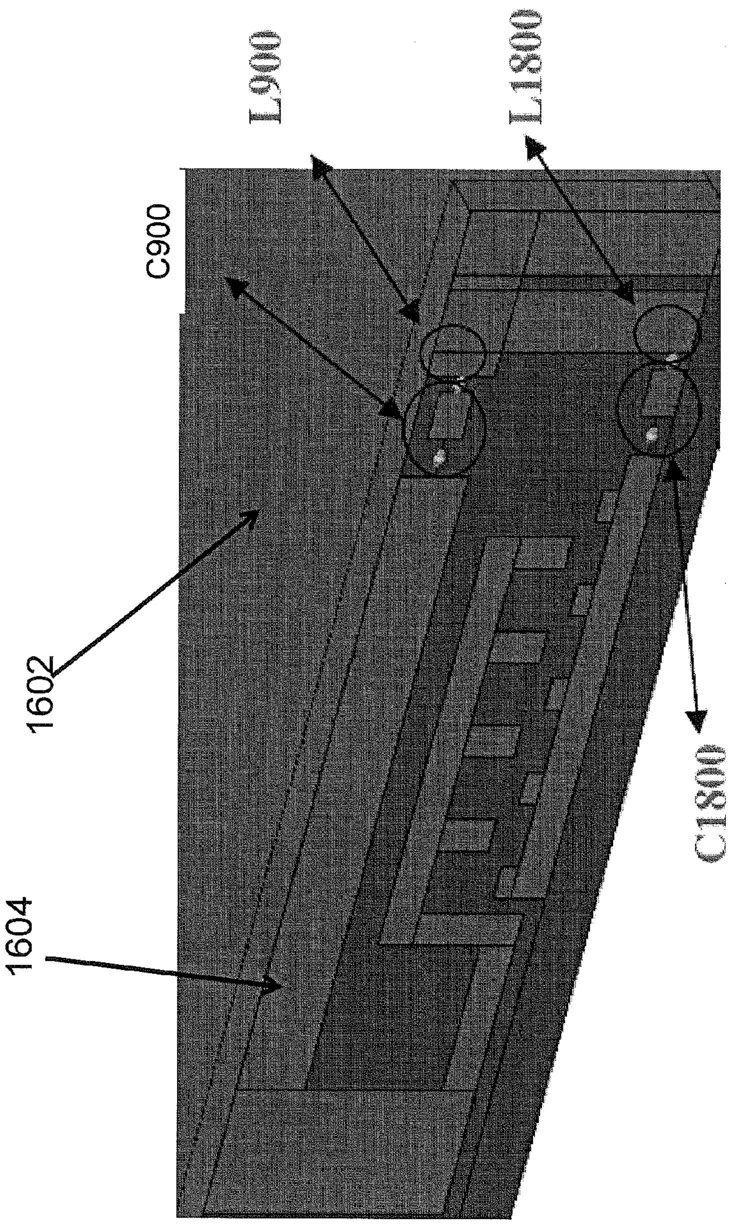
FIG. 16 is a line drawing of an exemplary antenna in accordance with one or more embodiments.

FIG. 16 illustrates a line drawing of an exemplary antenna 1604 in accordance with one or more embodiments. As shown in FIG. 16, the antenna 1604 may be associated with a layout to support multi-band operation. For example, a capacitor C900 and an inductor L900 may be associated with a first band (e.g., frequency band) of operation, and a capacitor C1800 and an inductor L1800 may be associated with a second band of operation.

The line drawing of FIG. 16 may correspond to the embodiment shown in FIG. 10. The capacitor C900 and the inductor L900 may correspond to capacitor 1004 and inductor 1006, respectively. The capacitor C1800 and the inductor L1800 may correspond to the capacitor 1008 and the inductor 1010, respectively. The antenna 1604 may be coupled to a chassis 1602 that may: (1) be associated with a ground plane, and (2) include a slot.

The various dimensions described above and shown in connection with the Figures (e.g., FIGS. 13A, 13B, and 14-16) are illustrative. Other sizes or values for the dimensions may be used in some embodiments. In some embodiments, values for dimensions or parameters shown in the Figures may be determined via analysis and/or simulation (e.g., computer simulation).

In some embodiments, an effective tuning of an antenna may be performed in real-time. For example, a tuning of components located on a chassis (e.g., chassis 402) may be done in real-time on a handset. A (pre-defined) table of values may be used to select or set a value for one or more of the components. The values may be based at least in part on an operating frequency or frequency range(s)/band(s) of interest. The values used for the components may be tuned to optimize or maximize radiation performance at the operating frequency or frequency range(s)/band(s). The table may include settings to improve performance, to compensate for detuning effects potentially brought about by, e.g., a user, etc.

As described herein, aspects of the disclosure may be used to design, fabricate, and use an antenna. The antenna may be associated with a computing device. The antenna may be tuned in connection with one or more frequencies or frequency bands/ranges. In some embodiments, an element may be tuned. For example, a tunable element may include a slot or an antenna.

As described herein, in some embodiments various functions or acts may take place at a given location and/or in connection with the operation of one or more apparatuses, systems, or devices. For example, in some embodiments, a portion of a given function or act may be performed at a first device or location, and the remainder of the function or act may be performed at one or more additional devices or locations.

Embodiments of the disclosure may be implemented using one or more technologies. In some embodiments, an apparatus or system may include one or more processors, and memory storing instructions that, when executed by the one or more processors, cause the apparatus or system to perform one or more methodological acts as described herein. Various mechanical components known to those of skill in the art may be used in some embodiments.

Embodiments of the disclosure may be implemented as one or more apparatuses, systems, and/or methods. In some embodiments, instructions may be stored on one or more computer-readable media, such as a transitory and/or non-transitory computer-readable medium. The instructions, when executed, may cause an entity (e.g., an apparatus or system) to perform one or more methodological acts as described herein. In some embodiments, the functionality described herein may be implemented in hardware, software, firmware, or any combination thereof.

Embodiments of the disclosure may be tied to one or more particular machines. For example, one or more tunable components may be loaded on a chassis. One or more tunable components may be loaded on an antenna structure. The location of the tunable components may be identified based on a simulation performed on a computing device.

The particular embodiments disclosed above are illustrative only and should not be taken as limitations upon the present disclosure, as the disclosure may be modified and practiced in different but equivalent manners apparent to those skilled in the art having the benefit of the teachings herein. Accordingly, the foregoing description is not intended to limit the disclosure to the particular form set forth, but on the contrary, is intended to cover such alternatives, modifications and equivalents as may be included within the spirit and scope of the disclosure as defined by the appended claims so that those skilled in the art should understand that they can make various changes, substitutions and alterations without departing from the spirit and scope of the disclosure in its broadest form.

What is claimed is:

1. A device comprising:

an antenna;

a chassis configured to be electrically coupled to the antenna, the chassis comprising a slot having at least one tunable component disposed within the slot, wherein:

the slot is aligned along a longitudinal edge of the chassis;

the slot is located in an area of the chassis based on an identification of surface currents in the area; and the antenna and chassis are electrically connected at a location based on the area.

2. The device of claim 1, wherein the slot has an open end.

3. The device of claim 1, wherein the slot has a closed end that extends to align with a shorter edge of the chassis.

4. The device of claim 1, wherein the at least one tunable component comprises a tunable capacitor coupled to an inductor.

5. The device of claim 1, wherein the at least one tunable component comprises at least two inductors.

6. The device of claim 1, wherein the device is a mobile electronic device.

7. A device comprising:

a chassis;

an antenna configured to be electrically coupled to the chassis based on an alignment of an elongated part of a structure of the antenna with a longitudinal edge of the chassis; and at least one tunable component that is disposed at a location on the antenna structure, where the location is based on an identification of a maximum surface current on the chassis at a particular operating frequency.

8. The device of claim 7, wherein the at least one tunable component comprises a tunable capacitor connected in series with an inductor.

9. The device of claim 8, wherein the at least one tunable component comprises a second tunable capacitor connected in series with a second inductor, and wherein the tunable capacitor and inductor are configured to provide tuning in a first frequency range, and wherein the second tunable capacitor and second inductor are configured to provide independent tuning in a second frequency range.

10. The device of claim 7, wherein the at least one tunable component comprises a tunable capacitor connected in parallel with an inductor.

11. The device of claim 7, wherein the structure is formed in accordance with a meandering profile to maximize an effective length of the antenna.

12. The device of claim 7, wherein the antenna does not include any clearance with respect to a ground associated with the chassis.

13. A method for controlling radiation associated with an antenna via a modification of a ground plane, comprising:

identifying surface currents in an area of a chassis electrically coupled to the antenna to select a location to electrically connect the antenna and chassis;

forming a slot in the area of the chassis to confine and control the surface currents;

aligning the formed slot to a longitudinal edge of the chassis;

disposing at least one tunable component within the slot;

tuning the at least one tunable component disposed in the slot to obtain a specified radiation performance of the antenna; and tuning the at least one tunable component disposed in the slot to control a current on the antenna surface to obtain a frequency tuning through the electrical coupling to the chassis.

14. The method of claim 13, wherein the controlling of the radiation is performed in real-time.

15. The method of claim 14, further comprising:

selecting a value for the at least one tunable component from a table of values.

16. The method of claim 13, further comprising:

performing a simulation to identify a location of the area on the chassis.

17. The method of claim 13, further comprising:
forming the slot by etching metal associated with a printed circuit board to expose a dielectric; and
placing the at least one tunable component on the dielectric and in contact with metal of the etched slot.

18. The method of claim 13, further comprising:
tuning the at least one tunable component disposed in the slot to align a resonance of the chassis with a resonance of the antenna.

19. The method of claim 13, further comprising:
switching in or out at least one component associated with the at least one tunable component.

20. The method of claim 13, wherein the tuning of the at least one tunable component disposed in the slot is adaptive to a resonance frequency of the antenna.

21. A method for controlling radiation associated with an antenna via a modification of a radiating structure of the antenna, comprising:
selecting a location on the radiating structure with a maximum surface current at a frequency of interest;
placing at least one tunable element at the location; and
electrically coupling the antenna to a chassis by aligning an elongated part of the radiating structure with a longitudinal edge of the chassis.

22. The method of claim 21, further comprising:
performing a simulation or a measurement to identify the location with the maximum surface current at the frequency of interest.

23. The method of claim 21, further comprising:
maximizing an effective length of the antenna by forming the structure in accordance with a meandering profile; and
minimizing a physical length of the antenna when forming the structure.

* * * * *